US012644922B2

(12) United States Patent
Garg et al.

(10) Patent No.: US 12,644,922 B2
(45) Date of Patent: Jun. 2, 2026

(54) REAL-TIME DEBUG IN LOW-POWER DEVICES

(71) Applicant: STMicroelectronics International N.V., Geneva (CH)

(72) Inventors: Gourav Garg, Kaithal (IN); Balwinder Singh Soni, Faridabad (IN); Dinesh Chandra Joshi, Greater Noida (IN); Sumit Kumar Singhal, Jaipur (IN)

(73) Assignee: STMicroelectronics International N.V., Geneva (CH)

( * ) Notice: Subject to any disclaimer, the term of this patent is extended or adjusted under 35 U.S.C. 154(b) by 71 days.

(21) Appl. No.: 18/816,685

(22) Filed: Aug. 27, 2024

(65) Prior Publication Data

US 2026/0063704 A1 Mar. 5, 2026

(51) Int. Cl.
*G01R 31/28* (2006.01)
*G01R 31/317* (2006.01)

(52) U.S. Cl.
CPC ... *G01R 31/2836* (2013.01); *G01R 31/31705* (2013.01); *G01R 31/31727* (2013.01)

(58) Field of Classification Search
CPC .......... G01R 31/2836; G01R 31/31705; G01R 31/31727
See application file for complete search history.

(56) References Cited

U.S. PATENT DOCUMENTS 8,782,480 B2 7/2014 Bansal
11,442,108 B1* 9/2022 Srinivasan ....... G01R 31/31713

2003/0051192 A1 3/2003 Pillay
2003/0093702 A1 5/2003 Luo
2011/0173363 A1 7/2011 Conti
2016/0077905 A1 3/2016 Menon et al.
2016/0098332 A1 4/2016 Liu
2022/0018901 A1* 1/2022 Jones ............... G01R 31/31705
2022/0082617 A1 3/2022 Kuehnis
2025/0208207 A1* 6/2025 Tan .................... G06F 11/3656
2025/0277850 A1* 9/2025 Jain ................. G01R 31/31721

FOREIGN PATENT DOCUMENTS

CN 112052132 B 9/2022

OTHER PUBLICATIONS

B. Vermeulen, "Functional Debug Techniques for Embedded Systems," in IEEE Design & Test of Computers, vol. 25, No. 3, pp. 208-215, May-Jun. 2008 (Year: 2008).*

(Continued)

*Primary Examiner* — Cynthia Britt

(74) *Attorney, Agent, or Firm* — Slater Matsil, LLP

(57) ABSTRACT

According to an embodiment, a method for debugging a low-power domain in a multi-power domain device is disclosed. The method includes mapping a critical signal of the low-power domain to a latch circuit of a register bank; capturing, by the latch circuit, transitions of the critical signal in registers of the register bank; observing, by a core circuit in a switchable power domain of the multi-power domain device, registers of the register bank; and determining a fault corresponding to the critical signal based on a value of the registers of the register bank.

20 Claims, 11 Drawing Sheets

(56) References Cited

OTHER PUBLICATIONS

T. Delavallée, P. Manet, H. Vandierendonck and J. -D. Legat, "Embedding functional simulators in compilers for debugging and profiling," 2011 Faible Tension Faible Consommation (FTFC), Marrakech, Morocco, 2011, pp. 55-58 (Year: 2011).*

A. Schoofs, G. M. P. O'Hare and A. G. Ruzzelli, "Debugging Low-Power and Lossy Wireless Networks: A Survey," in IEEE Communications Surveys & Tutorials, vol. 14, No. 2, pp. 311-321, Second Quarter 2012 (Year: 2012).*

* cited by examiner

200

300

700

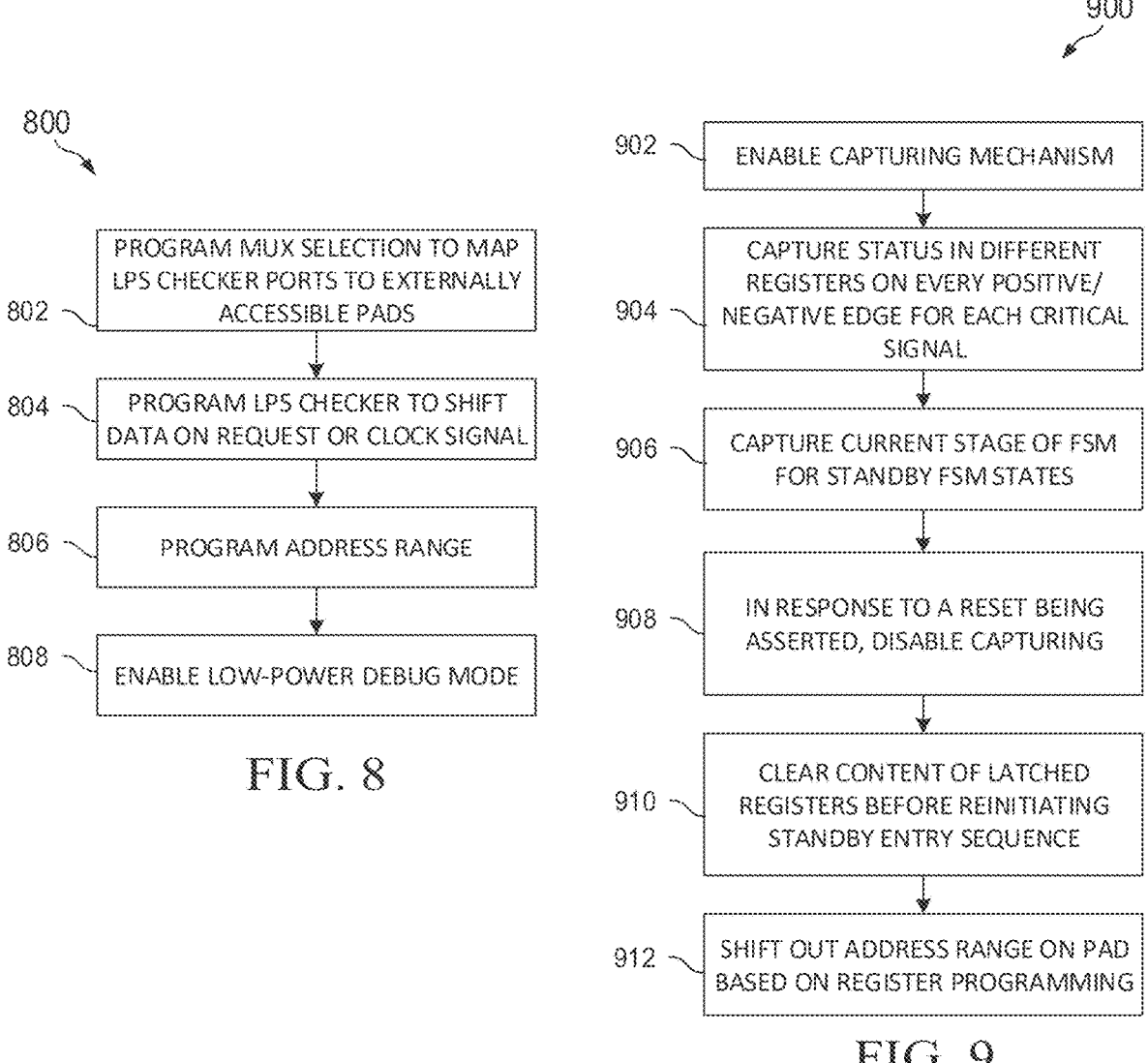

800

802 — PROGRAM MUX SELECTION TO MAP LPS CHECKER PORTS TO EXTERNALLY ACCESSIBLE PADS

804 — PROGRAM LPS CHECKER TO SHIFT DATA ON REQUEST OR CLOCK SIGNAL

806 — PROGRAM ADDRESS RANGE

808 — ENABLE LOW-POWER DEBUG MODE

902 — ENABLE CAPTURING MECHANISM

904 — CAPTURE STATUS IN DIFFERENT REGISTERS ON EVERY POSITIVE/ NEGATIVE EDGE FOR EACH CRITICAL SIGNAL

906 — CAPTURE CURRENT STAGE OF FSM FOR STANDBY FSM STATES

908 — IN RESPONSE TO A RESET BEING ASSERTED, DISABLE CAPTURING

910 — CLEAR CONTENT OF LATCHED REGISTERS BEFORE REINITIATING STANDBY ENTRY SEQUENCE

912 — SHIFT OUT ADDRESS RANGE ON PAD BASED ON REGISTER PROGRAMMING

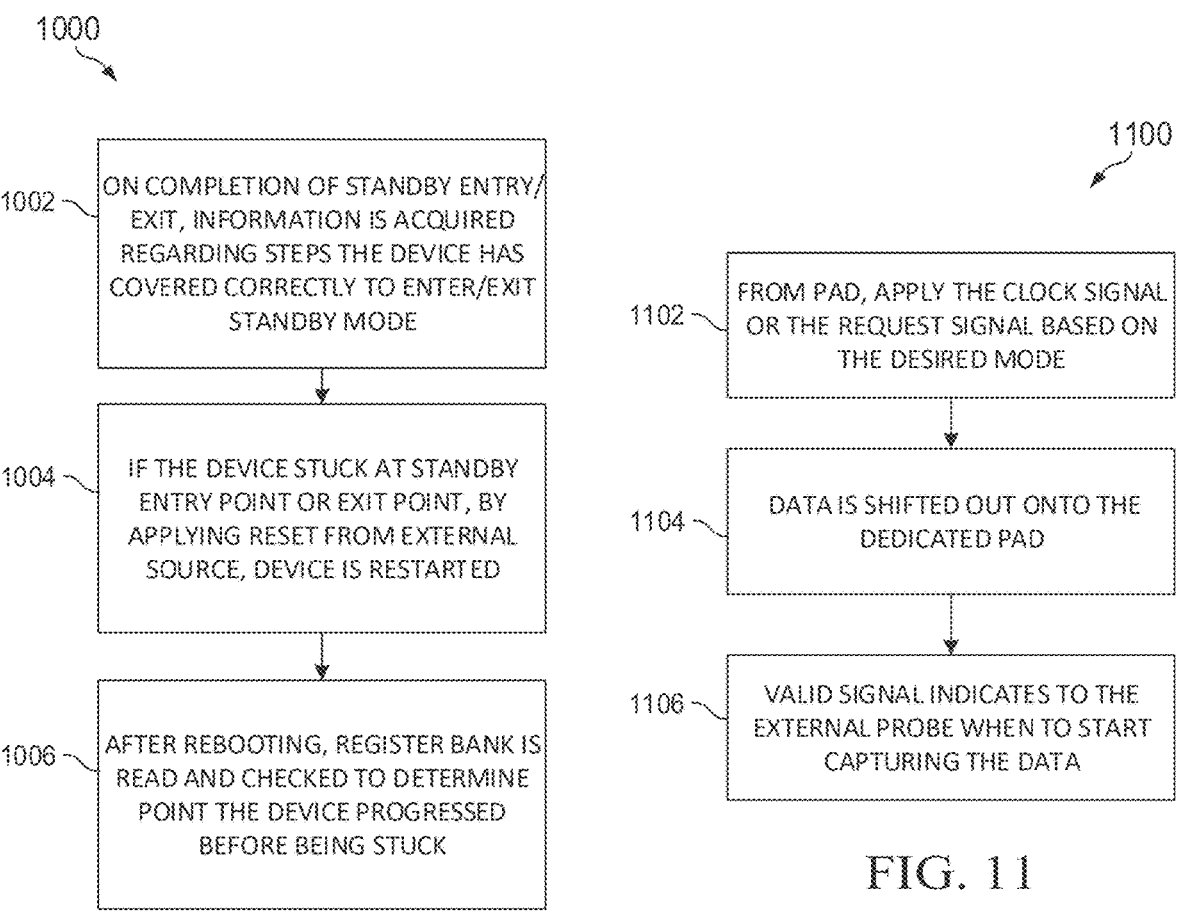

1002 — ON COMPLETION OF STANDBY ENTRY/EXIT, INFORMATION IS ACQUIRED REGARDING STEPS THE DEVICE HAS COVERED CORRECTLY TO ENTER/EXIT STANDBY MODE

1004 — IF THE DEVICE STUCK AT STANDBY ENTRY POINT OR EXIT POINT, BY APPLYING RESET FROM EXTERNAL SOURCE, DEVICE IS RESTARTED

1006 — AFTER REBOOTING, REGISTER BANK IS READ AND CHECKED TO DETERMINE POINT THE DEVICE PROGRESSED BEFORE BEING STUCK

1102 — FROM PAD, APPLY THE CLOCK SIGNAL OR THE REQUEST SIGNAL BASED ON THE DESIRED MODE

1104 — DATA IS SHIFTED OUT ONTO THE DEDICATED PAD

1106 — VALID SIGNAL INDICATES TO THE EXTERNAL PROBE WHEN TO START CAPTURING THE DATA

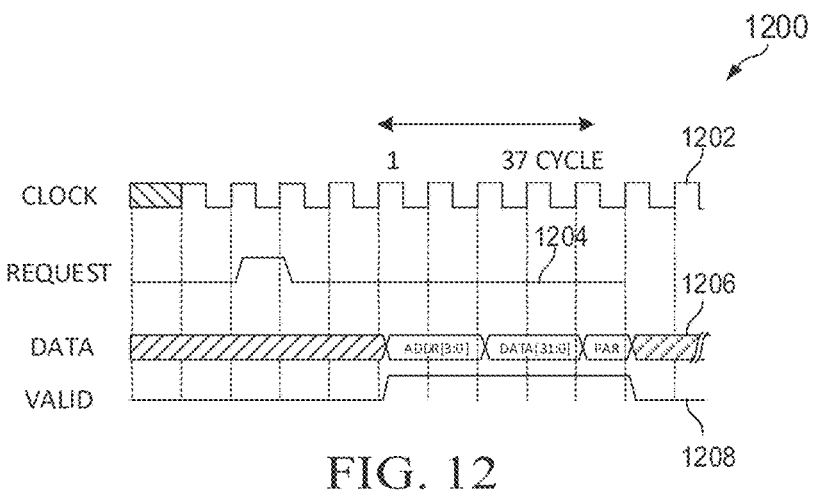

1    37 CYCLE    1202

CLOCK

REQUEST    1204

DATA    ADDR[3:0]  DATA[31:0]  PAR    1206

VALID    1208

FIG. 12

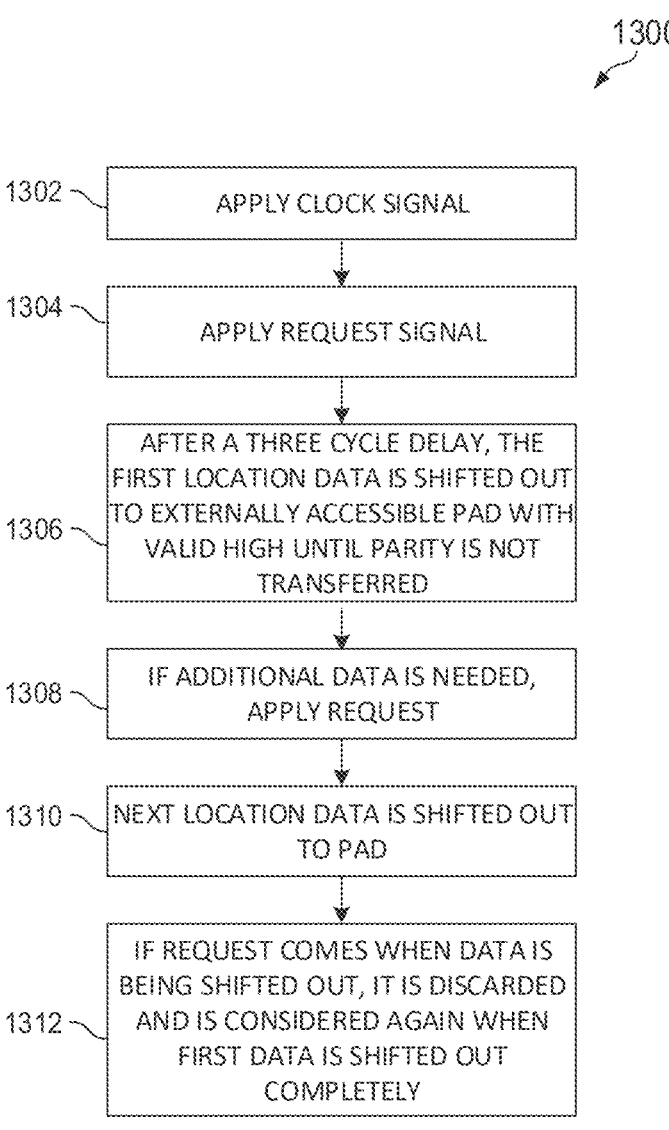

1300

1302 — APPLY CLOCK SIGNAL

1304 — APPLY REQUEST SIGNAL

1306 — AFTER A THREE CYCLE DELAY, THE FIRST LOCATION DATA IS SHIFTED OUT TO EXTERNALLY ACCESSIBLE PAD WITH VALID HIGH UNTIL PARITY IS NOT TRANSFERRED

1308 — IF ADDITIONAL DATA IS NEEDED, APPLY REQUEST

1310 — NEXT LOCATION DATA IS SHIFTED OUT TO PAD

1312 — IF REQUEST COMES WHEN DATA IS BEING SHIFTED OUT, IT IS DISCARDED AND IS CONSIDERED AGAIN WHEN FIRST DATA IS SHIFTED OUT COMPLETELY

APPLY CLOCK SIGNAL — 1502

AFTER 3 CYCLES, THE FIRST LOCATION DATA IS SHIFTED OUT TO PAD WITH VALID HIGH UNTIL PARITY IS NOT TRANSFERRED — 1504

NEXT LOCATION DATA IS SHIFTED OUT TO PAD — 1506

REAL-TIME DEBUG IN LOW-POWER DEVICES

TECHNICAL FIELD

The present disclosure generally relates to electronic devices and, in particular embodiments, to real-time debugging in low-power devices.

BACKGROUND

In contemporary System-on-Chip (SoC) designs, engineers employ various methods to monitor the status of cores and intellectual property (IP) blocks during runtime. These techniques generally fall into two categories. The first, a common industry practice, involves capturing the IP state, status, and control signals in registers that can be accessed through standard bus interfaces (e.g., Advanced eXtensible Interface (AXI), Advanced High-Performance Bus (AHB), etc.) while the device runs via the core. The second approach utilizes industry-standard debug interfaces to snoop the core interface, allowing debug operations to initiate read or write transactions to the core or IP. The resulting data can then be observed on pads or stored in RAM locations. Conventionally, these two widely adopted techniques are used to identify issues on silicon during testing or application development, particularly when encountering unexpected behavior or system hang-ups.

SUMMARY

Technical advantages are generally achieved by embodiments of this disclosure, which describe real-time debugging in low-power devices.

A first aspect relates to a method for debugging a low-power domain in a multi-power domain device. The method includes mapping a critical signal of the low-power domain to a latch circuit of a register bank; capturing, by the latch circuit, transitions of the critical signal in registers of the register bank; observing, by a core circuit in a switchable power domain of the multi-power domain device, registers of the register bank; and determining a fault corresponding to the critical signal based on a value of the registers of the register bank.

A second aspect relates to a method for debugging a low-power domain in a multi-power domain device. The method includes mapping a critical signal of the low-power domain to a latch circuit of a register bank; capturing, by the latch circuit, transitions of the critical signal in registers of the register bank; mapping, by a low-power system capture circuit in the low-power domain, data stored in the registers of the register bank to an externally accessible pad; and determining a fault corresponding to the critical signal based on a value of the externally accessible pad.

A third aspect relates to a multi-power domain device comprising a low-power domain. The low-power domain includes a register bank, the register bank configured to store captured values associated with transitions of critical signals of the low-power domain during a debug mode; a plurality of externally accessible pads; and a low-power system capture circuit configured to map data stored in registers of the register bank to a first externally accessible pad to determine faults within the low-power domain.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which:

FIG. 8 is a flow chart of an embodiment method for configuring a multi-power domain device for debugging;

FIG. 9 is a flow chart of an embodiment method for capturing and managing critical signal data in a multi-power domain device;

FIG. 10 is a flow chart of an embodiment method for analyzing and recovering from standby mode issues in a multi-power domain device;

FIG. 11 is a flow chart of an embodiment method for the data retrieval process during the debugging of a multi-power domain device;

FIG. 12 is a timing diagram of an embodiment protocol to read data through a pad interface;

FIG. 13 is a flow chart of an embodiment method for reading the data through the pad interface based on protocol;

DETAILED DESCRIPTION OF ILLUSTRATIVE EMBODIMENTS

Figure 1:
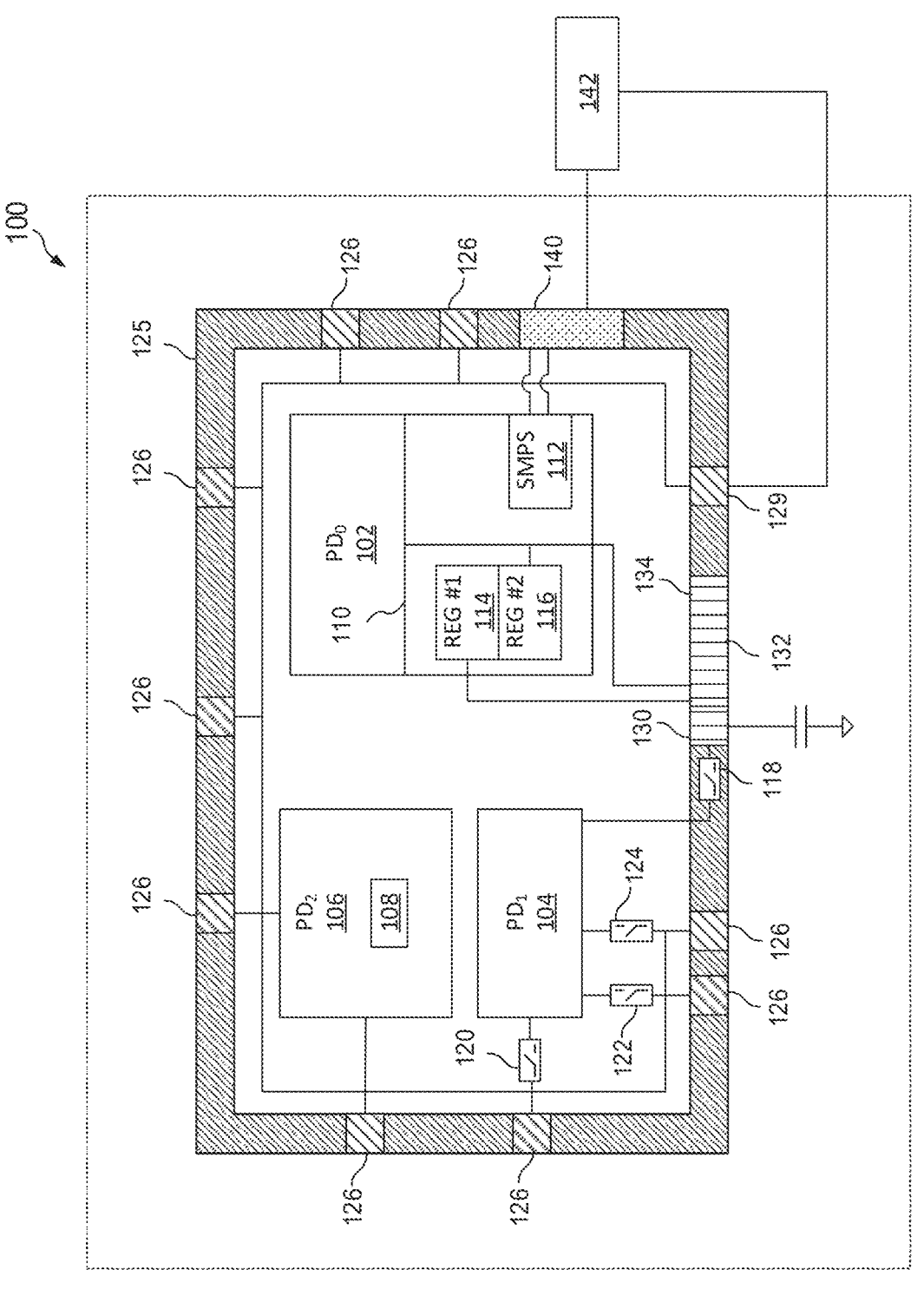
FIG. 1 is a block diagram of an embodiment system-on-chip (SoC)

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of the low-power domain in a multi-power domain device, it should also be appreciated that these inventive aspects may also apply to other power domains, such as the normal run mode operations. Further, aspects of the disclosure are discussed in the context of debugging a multi-power domain device during the design phases; however, it should be appreciated that embodiments of this disclosure can be applied for troubleshooting or monitoring during regular functional operating modes of the device using, for example, a built-in test circuit.

Aspects of the disclosure propose a multi-power domain device, method of operation, and protocols to efficiently debug devices in low-power mode, providing real-time observability of critical signals. It incorporates a parity bit system that flags any single bit flipping on the transmission path during data shifting, enhancing error detection. This approach eliminates the need for multiple iterations to debug stuck conditions, as it captures the complete sequence status in a single run.

The proposed approach is designed with minimal pad requirements, needing a maximum of four pads and a minimum of three, addressing potential pad limitation issues. The system allows direct access to previous sequence data through a core circuit interface for scenarios where pad usage is not preferred. Advantageously, the proposed approach is non-invasive, functioning as a snooping logic that does not interfere with existing device functionality.

The versatility of the proposed scheme extends beyond low power modes, as it is applicable in normal run mode operations. It also proves valuable when the device is stuck under reset conditions (excluding full chip power-on reset) and standard masters are unavailable. The comprehensive approach provides a robust debugging tool that enhances device diagnostics across various operational states and conditions.

Due to the limitations in existing debugging approaches for standby mode in multi-power domain devices, there is a need for more effective solutions that can provide comprehensive visibility into the states of the multi-power domain device without significantly impacting power consumption or requiring complex architectural changes.

In embodiments, the status of registers can be brought out to the device pads in response to specific requests applied to those pads. This proposed approach allows for external observation of internal states even when a core circuit is inactive. In embodiments, data is latched and saved during every standby entry and exit sequence. Once active, the core circuit can read the latched data, providing a historical state record during low-power transitions.

Aspects of this disclosure offer several key advantages for debugging low-power devices. The proposed approach provides continuous observation of critical device signals on the pads, allowing engineers to monitor essential information in real time. Additionally, the proposed approach can capture and store latched data for low-power entry and exit sequences, creating a valuable record of transitions. The proposed approach eliminates the need to keep any standard primary circuit (e.g., core circuit) powered on, preserving original design functionality without modifications. The implementation significantly accelerates debugging when multi-power domain devices become stuck during standby mode entry or exit.

Moreover, the proposed approach is simple to implement, requiring minimal additional hardware. Advantageously, the system preserves critical signal transition data in a register bank, safeguarding it against loss during a reset. Accordingly, valid data is captured, excluding any erroneous transitions caused by reset events. Combining these features, the proposal offers a comprehensive and efficient technique for debugging and analyzing low-power device behavior without compromising power efficiency or design integrity. These and additional details are further described below.

FIG. 1 illustrates a block diagram of an embodiment system-on-chip (SoC) 100. System-on-chip 100 is configured to have multiple power domains. System-on-chip 100 may be a component of an electronic device, such as a computer, a mobile phone, a home appliance, or the like.

System-on-chip 100 includes a first power domain (PD$_0$) 102, a second power domain (PD$_1$) 104, and a third power domain (PD$_2$) 106, which may (or may not) be arranged as shown.

Optionally, system-on-chip 100 may include a controller 108 operating in, for example, the third power domain 106 to minimize the taxing resources of the first power domain 102 and second power domain 104.

Also shown are RUN mode switches 120, 122, and 124, and a low-power switch 118. RUN mode switches 120, 122, and 124 are arranged between the third power domain 106 and the second power domain 104. The low-power switch 118 is arranged between the first power domain 102 and the second power domain 104. It should be appreciated that when the RUN mode switches 120, 122, and 124, and low-power switch 118 are closed, all three low-voltage power domains effectively behave as a single low-voltage power domain.

System-on-chip 100 may include a ring pad 125 where the I/O pads of the system-on-chip 100 are located. Power supply pads 126 on the ring pad 125 correspond to the third power domain 106 supply pads. System-on-chip 100 may include additional components not shown in FIG. 1. Further, system-on-chip 100 may have other power domains or supplies (not shown). The number of I/O pads illustrated in FIG. 1 for system-on-chip 100 is non-limiting, and embodiments with fewer or greater pads are similarly contemplated.

First power domain 102, second power domain 104, and third power domain may collectively be referred to as the power domains of the system-on-chip 100. Each power domain may include its respective electrical components or circuits that perform certain functions. Each of the first power domain 102, second power domain 104, and third power domain 106 may operate on a low-voltage (LV) supply. First power domain 102 may also include a high-voltage (HV) supply to provide the various low-voltage supplies in the different power domains in one configuration of the system-on-chip 100.

The first power domain 102 can also be called a standby power domain, an ultra-low-power (ULP) power domain, or an always-on power domain. It is powered on during the standby mode. In embodiments, the first power domain 102 monitors user input during the standby mode and, in response to detecting a user input, exits the standby mode and enters low-power mode or RUN mode.

The second power domain 104 can also be called a low-power (LP) power domain. When the first power domain 102 is powered on, the second power domain 104 may be powered off during the standby mode of system-on-chip 100. In embodiments, the second power domain 104 may perform certain functions at reduced power consumption in the low-power (LP) power mode. In the low-power power mode, the first power domain 102 and the second power domain 104 are powered on, and the third power domain 106 is powered off.

The third power domain 106 can also be referred to as a RUN mode power domain or a switchable power domain. The third power domain 106 may be powered off during the standby mode of system-on-chip 100 when the first power domain 102 is powered on and the second power domain 104 is powered off. Third power domain 106 may be switchably powered on or powered off at other times. In embodiments, the third power domain 106 may be used for performing a full-power operation in the RUN mode when the maximum performance of the system-on-chip 100 is required. System-on-chip 100 may exit the low-power mode to enter the RUN mode. In the RUN mode, the first power domain 102, the second power domain 104, and the third power domain 106 are all powered on.

In embodiments, a power domain is said to be powered on, or being powered, when a supply voltage is provided to the power domain to turn on (e.g., providing the supply voltage) circuits operating within the power domain. When a power domain no longer receives the supply voltage, the power domain is said to be powered off, turned off, or not powered.

In embodiments, the first power domain 102 includes a power management unit (PMU) 110. The power management unit 110 may include a switched-mode power supply (SMPS) 112 (e.g., buck converter, boost converter, etc.), a first regulator 114, and a second regulator 116.

Switched-mode power supply 112 is switched on and off alternately by a respective control signal (e.g., a pulse-width modulated (PWM) control signal) to provide a supply voltage. Switched-mode power supply 112 may supply power to the first power domain 102, the second power domain 104, and the third power domain 106. In embodiments, the first regulator 114 is powered off in response to the switched-mode power supply 112 powering the first power domain 102 and the second power domain 104.

In embodiments, the first regulator 114 is a linear voltage regulator configured to provide a low voltage supply. The first regulator 114 may have a ballast 132 located in the ring pad 125 of system-on-chip 100-ballast 132 is internal to the ring pad 125. In embodiments, ballast 132 includes a low-voltage (LV) supply pad 130 and a high-voltage (HV) supply pad 134. Low-voltage (LV) supply pad 130 may be coupled with a low-voltage supply package pin. High-voltage supply pad 134 may be coupled with a high-voltage supply package pin.

In embodiments, the second regulator 116 is a linear regulator configured to provide an ultra-low voltage supply. The second regulator 116 may power the first power domain 102 during a standby mode of system-on-chip 100. The second regulator 116 may have its loop closed within the power management unit 110. A ballast for the second regulator 116 may be located within the power management unit 110. In embodiments, the second regulator 116 is powered on only during the standby mode of system-on-chip 100.

In embodiments, the first power domain 102 receives power from the low-voltage (LV) supply pad 130. In embodiments, the third power domain 106 receives power from the power supply pads 126. In embodiments, the second power domain 104 receives power through the first power domain 102, the third power domain 106, or both the first power domain 102 and the third power domain 106 depending on the configuration of the low-power switch 118 and RUN mode switches 120, 122, and 124. The low-power switch 118 and the RUN mode switches 120, 122, and 124 are controlled through respective pads within the first power domain 102, which is always on once the device is powered up (i.e., allowing the switches to open and close regardless of whether the second power domain 104 or third power domain 106 are powered up).

The second power domain 104 is decoupled from the first power domain 102 and the third power domain 106 in response to the low-power switch 118 and RUN mode switches 120, 122, and 124 being in an open position. In this configuration, the second power domain 104 is powered off.

In response to the low-power switch 118 being closed and RUN mode switches 120, 122, and 124 being open, the first power domain 102 is coupled to the second power domain 104, and the first regulator 114 may be powering both the first power domain 102 and the second power domain 104. It should be appreciated that additional switches may be used to couple the first power domain 102 and the second power domain 104.

In response to the low-power switch 118 being open and RUN mode switches 120, 122, and 124 being in a closed position, the third power domain 106 is coupled to the second power domain 104, such that the switched-mode power supply 112 provides a supply voltage to both power domains. In embodiments, RUN mode switches 120, 122, and 124 are in a closed position in response to the switched-mode power supply 112 is powered. Although system-on-chip 100 is shown to have three RUN mode switches 120, 122, and 124, the number of RUN mode switches are non-limiting, and fewer or greater RUN mode switches may be included in other embodiments.

Finally, in response to the low-power switch 118 and the RUN mode switches 120, 122, and 124 being in a closed position, the second power domain 104 is coupled to the first power domain 102 and the third power domain 106. In this configuration, switched-mode power supply 112 provides a supply voltage to the third power domain 106, the second power domain 104 (through the RUN mode switches 120, 122, and 124), and the first power domain 102 (through the low-power switch 118).

In embodiments, power management unit 110 is used to control the operation (open or closed position) of the low-power switch 118 and the RUN mode switches 120, 122, and 124. In embodiments, the low-power switch 118 and the RUN mode switches 120, 122, and 124 are configured to be closed in response to no high voltage (HV) supply being made available to the switched-mode power supply 112. In embodiments, power management unit 110 controls the operation of the first regulator 114 and the second regulator 116.

In embodiments, the switched-mode power supply 112 of the system-on-chip 100 is coupled to an external (e.g., off-chip component) circuit 142 through pad 140. Circuit 142 may include, for example, a ballast, an inductor, and a capacitor. In response to the system-on-chip 100 being coupled to circuit 142, the switched-mode power supply 112 provides a voltage supply at a package pin coupled to power supply pad 129, which is coupled to power supply pads 126 through a power bar (between the package and the die of system-on-chip 100). Thus, the switched-mode power supply 112 can (i) power the third power domain 106 and (ii) power the second power domain 104 and the first power domain 102 (depending on the configuration of the low-power switch 118 and the RUN mode switches 120, 122, and 124).

Figure 2:
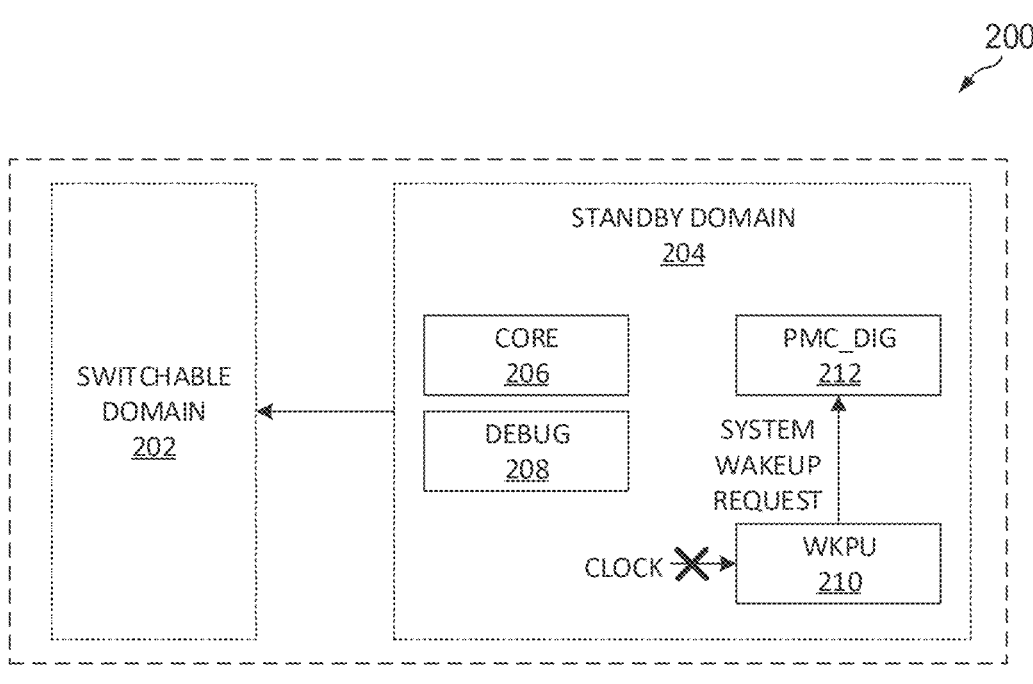
FIG. 2 is a simplified block diagram of a multi-power domain device.

FIG. 2 illustrates a simplified block diagram of a multi-power domain device 200. The multi-power domain device 200 includes a switchable domain 202 and a standby domain 204, which may (or may not) be arranged as shown. In embodiments, the switchable domain 202 and the standby domain 204 may be implemented, respectively, as the third power domain 106 and the first power domain 102 of the system-on-chip 100 of FIG. 1. Here, the switchable domain 202 is powered OFF.

In embodiments, the standby domain 204 includes a core circuit 206, a debug interface 208, a wake-up circuitry (WKPU) 210, and a digital power management controller (PMC_DIG) 212, which may (or may not) be arranged as shown. Standby domain 204 may include additional components not shown, such as additional core circuits, a clock generator, or an analog power management controller.

The core circuit 206 can be configured as a primary controller in the standby domain 204. It is configured to execute instructions and manage overall system operations within the standby domain 204. In embodiments, the core circuit 206 is an ARM-based processor.

The debug interface 208 provides essential system development and troubleshooting tools, including interfaces like Joint Test Action Group (JTAG) or Serial Wire Debug (SWD), breakpoint units, and trace circuits. It allows engineers to monitor and control the internal state of the standby domain 204 during operation.

The wake-up circuitry 210 is configured to remain partially active in standby mode. It monitors various sources for wake-up events, such as interrupts from peripherals or timer expiration, and initiates bringing the system out of standby when triggered by a clock signal.

The digital power management controller 212 is coupled to the wake-up circuitry 210 and configured to control the power management of the digital circuits within the standby domain 204. It can manage a complex sequence of powering down digital components when entering standby mode and powering them back up upon exit, ensuring proper voltage levels and timing to maintain system integrity.

During normal operation, the core circuit 206, the debug interface 208, the wake-up circuitry 210, and the digital power management controller 212 work together to provide full functionality and debugging capability. However, in standby mode, the core circuit 206 and the debug interface 208 are typically powered down to conserve energy, while the wake-up circuitry 210 and parts of the digital power management controller 212 remain active to monitor for wake-up events and maintain a minimal system state. This configuration allows for significant power savings but creates challenges for debugging issues during standby mode or its transitions, as the usual means of system observation and control can become unavailable in this low-power state. Critical signals, which are part of the design but not directly accessible through the IP's register interface, play crucial roles in standby operations.

Due to hardware or software issues, debugging becomes challenging if the multi-power domain device 200 device gets stuck during standby entry, exit, or while in standby mode. For example, if multi-power domain device 200 is in standby mode and receives a wake-up request but fails to exit, engineers cannot determine if the clock is running or if the software correctly selected the desired wake-up source or clock. This information can be inaccessible in standby mode as the core circuit 206 and debug interface 208 are powered down.

Figure 3:
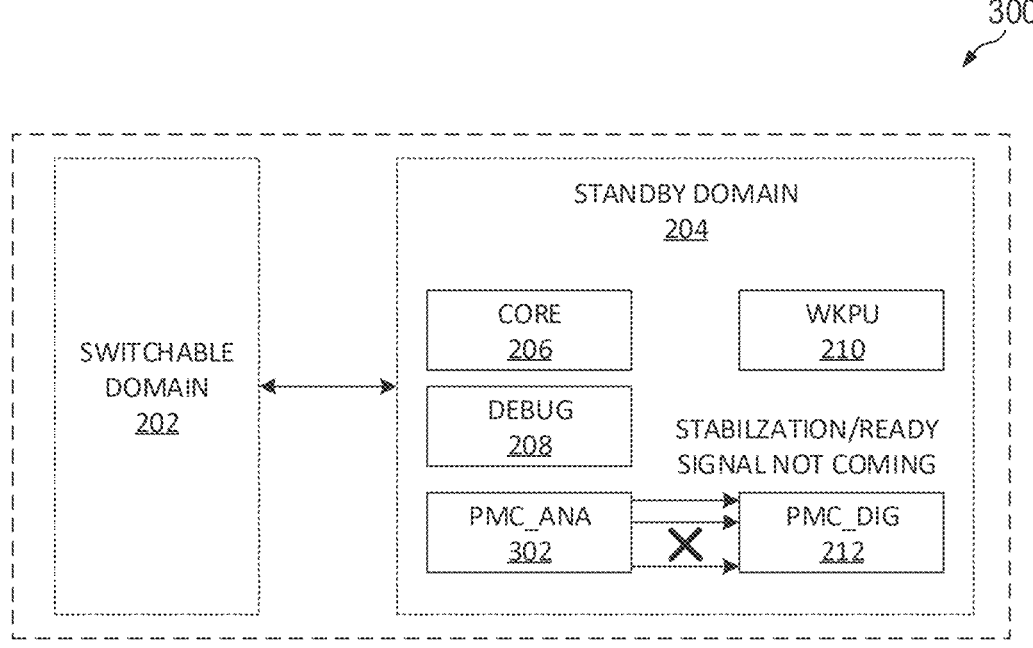
FIG. 3 is a simplified block diagram of a multi-power domain device.

FIG. 3 illustrates a simplified block diagram of a multi-power domain device 300. The multi-power domain device 300 includes the switchable domain 202 and the standby domain 204, which may (or may not) be arranged as shown. Here, the switchable domain 202 is powered OFF.

In embodiments, the standby domain 204 includes the core circuit 206, the debug interface 208, the wake-up circuitry 210, the digital power management controller 212, and an analog power management controller (PMC_ANA) 302, which may (or may not) be arranged as shown. Standby domain 204 may include additional components not shown, such as additional core circuits or a clock generator.

The analog power management controller 302 is coupled to the digital power management controller 212 and configured to control the power management of the analog circuits within the standby domain 204. It can manage a complex sequence of powering down analog components when entering standby mode and powering them back up upon exit, ensuring proper voltage levels and timing to maintain system integrity.

A problematic scenario can occur when the entry sequence stalls when requesting standby mode. The sequence begins when a primary circuit, such as the core circuit 206, initiates a standby request after confirming that all other components of the multi-power domain device 300 are in an idle state. Following this request, the initiating primary circuit enters a wake-for-interrupt (WFI) mode, effectively relinquishing control.

At this point, the responsibility for power sequencing shifts to the analog power management controller 302 for analog components and the digital power management controller 212 for digital components. These controllers engage in a handshaking process to, for example, coordinate the power-down sequence.

However, this handshaking phase presents a significant challenge for debugging. Under normal circumstances, when the multi-power domain device 300 enters standby mode successfully, the power consumption decreases significantly indicating no issues. However, if an issue occurs during the standby entry process, the power consumption remains unexpectedly high. This persistent high consumption can serve as the primary, and often only, indication at the silicon level that something has gone awry in the standby mode transition. Further, if the standby entry FSM expects certain inputs that never arrive, it may become permanently stuck.

Accordingly, any issues during the handshake process become difficult to detect and analyze. The absence of an available primary circuit during this sequence of events prevents engineers from snooping on the state or checking the exact status of the design after the standby request is issued. This lack of visibility means that the success or failure of the standby entry process remains unknown until the sequence is completed, leaving engineers without information for troubleshooting potential problems in the interim stages.

Figure 4:
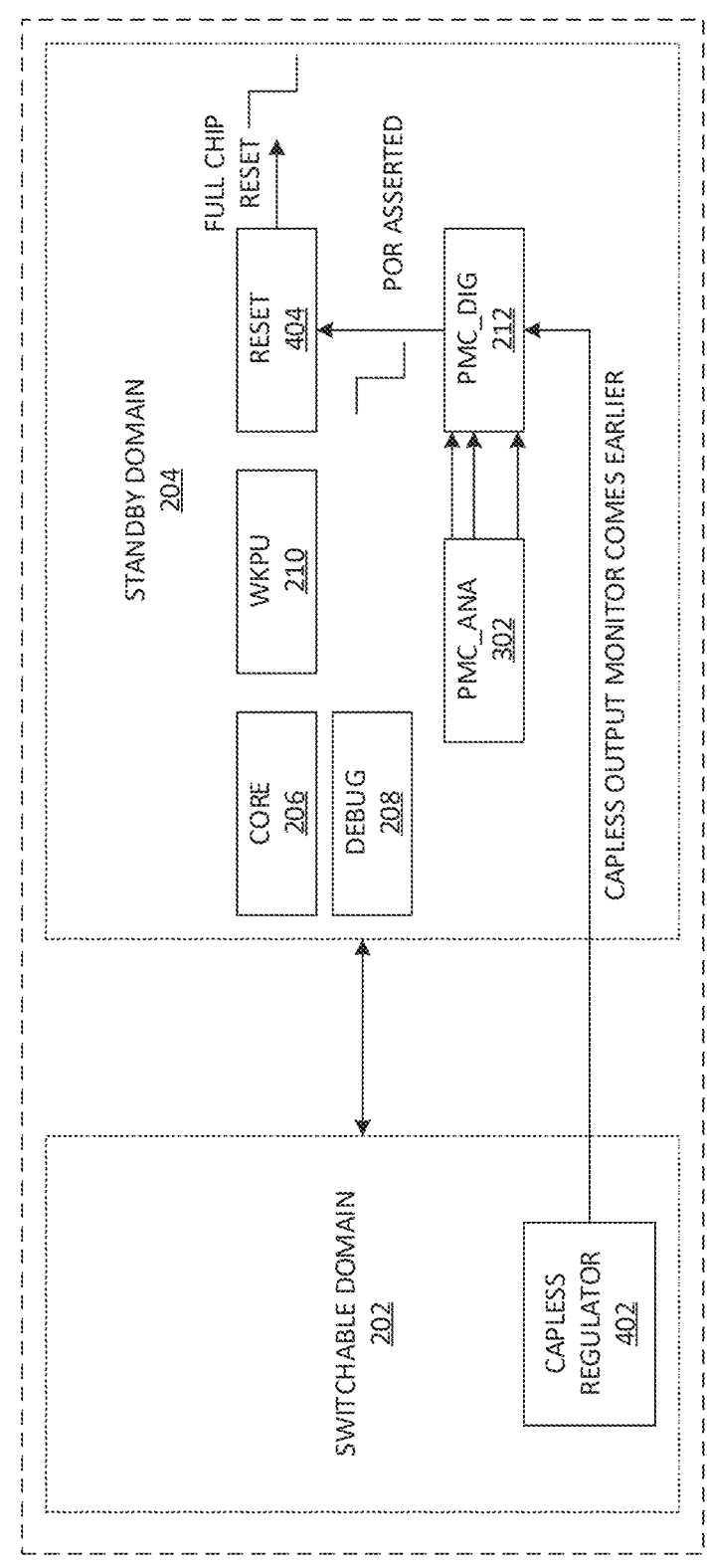
FIG. 4 is a simplified block diagram of a multi-power domain device.

FIG. 4 illustrates a simplified block diagram of a multi-power domain device 400. The multi-power domain device 400 includes the switchable domain 202 and the standby domain 204, which may (or may not) be arranged as shown.

In embodiments, the switchable domain 202 includes a capless (capacitor-less) regulator 402. Switchable domain 202 may include additional components not shown. Here, the switchable domain 202 is powered ON.

In embodiments, the capless regulator 402 operates without large external capacitors, which are typically required for stability and output smoothing in traditional designs. By eliminating these external components, the capless regulator 402 offers significant space efficiency and cost reduction advantages. It can provide faster transient response than its traditional counterparts and can manage different voltage levels required by various subsystems in multi-power domain devices.

Capless regulator 402 is configured to act as an interface between the switchable domain 202 and the standby domain 204, facilitating efficient power management during the different operational states of the multi-power domain device 400.

During normal operation, when the multi-power domain device 400 is in its runtime mode, the capless regulator 402 ensures that the switchable domain 202 receives the necessary voltage to keep critical circuits powered and ready for quick activation. As the multi-power domain device 400 transitions into standby mode, the capless regulator 402 transitions to power down mode, while minimizing overall power consumption.

The ability of the capless regulator 402 to quickly respond to load changes becomes particularly important during the transition between runtime and standby modes. It helps maintain stable voltage levels during these transitions, preventing potential issues from voltage fluctuations. When a wake-up event occurs, the capless regulator 402 rapidly adjusts to provide the power for the switchable domain 202 to resume full operation, ensuring a smooth and quick transition back to runtime mode.

In embodiments, the standby domain 204 includes the core circuit 206, the debug interface 208, the wake-up circuitry 210, the digital power management controller 212, the analog power management controller 302, and a reset circuit 404, which may (or may not) be arranged as shown. Standby domain 204 may include additional components not shown, such as additional core circuits or a clock generator.

In contrast to the situation in FIG. 3, the wake-up circuitry 210 is operating properly here. However, an issue may arise during standby entry or exit sequences due to a prematurely asserted reset after the primary circuit initiates a standby request.

For example, if the signal from the capless regulator 402 arrives earlier than anticipated, the digital power management controller 212 may assert a power-on-reset to the reset circuit 404, which causes a full reset of the multi-power domain device 400.

The unexpected timing of the capless regulator's signal and the resulting full device reset make it difficult for engineers to pinpoint the exact problem, the specific point in the standby transition sequence where the problem occurred, or predict the cause of the reset. This lack of visibility into the internal state at the time of reset complicates the debugging process and can lead to extended troubleshooting times.

Figure 5:
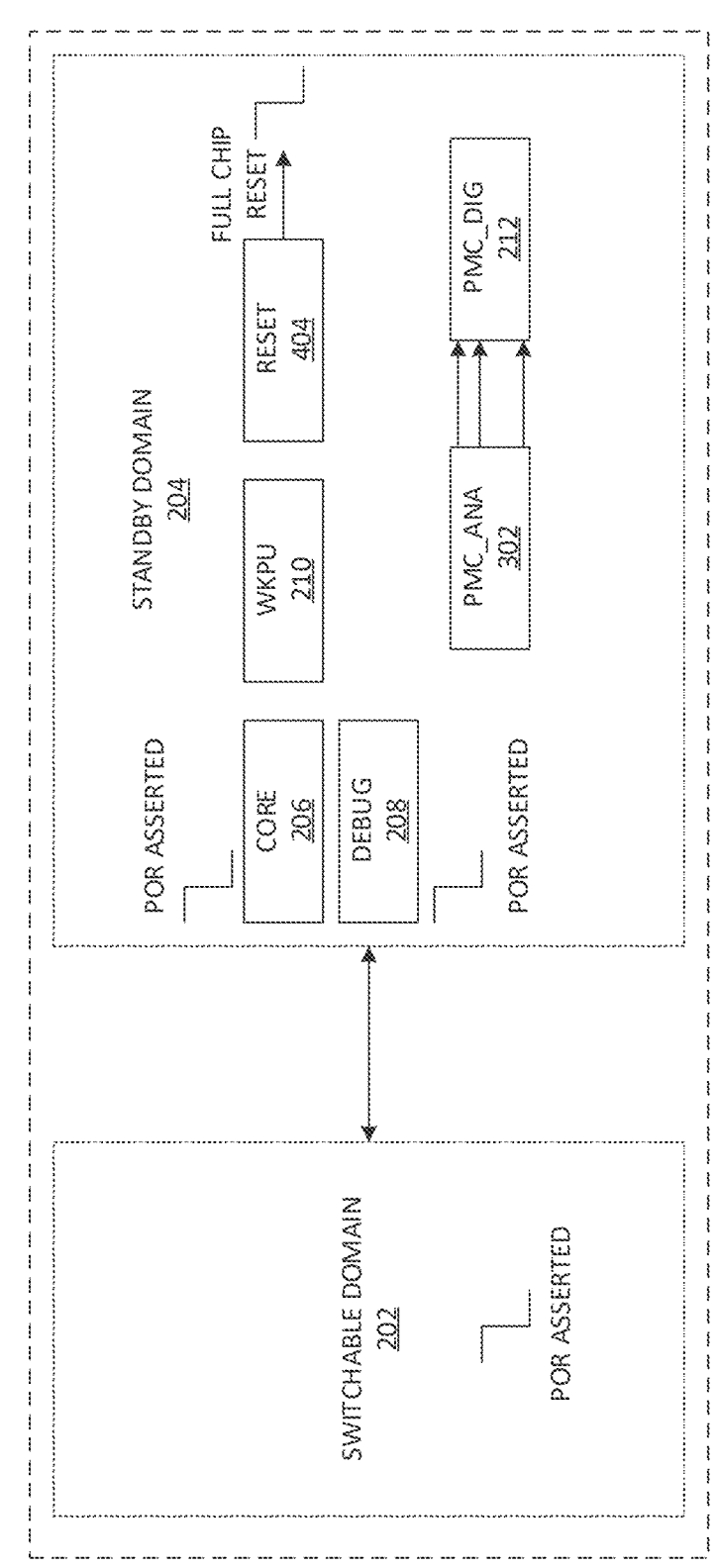
FIG. 5 is a simplified block diagram of a multi-power domain device.

FIG. 5 illustrates a simplified block diagram of a multi-power domain device 500. The multi-power domain device 500 includes the switchable domain 202 and the standby domain 204, which may (or may not) be arranged as shown.

In embodiments, the standby domain 204 includes the core circuit 206, the debug interface 208, the wake-up circuitry 210, the digital power management controller 212, the analog power management controller 302, and the reset circuit 404, which may (or may not) be arranged as shown. Standby domain 204 may include additional components not shown, such as additional core circuits or a clock generator.

An issue may arise when the multi-power domain device 500 is under reset, and the only means of recovery is a power-on reset. The reset signal is a temporary signal and is not constantly asserted. Accordingly, there may be a case where the multi-power domain device 500 cannot exit when the reset signal is asserted. As the primary circuit is disabled for debugging, it becomes challenging to understand why the device is not restarting.

This non-limiting list of problems can be particularly painful for application and validation teams working on new low-power devices. Based on experience with two low-power SoCs on silicon, debugging even minor software mistakes can take weeks. Numerous validation iteration is often required to understand why the system hangs or unexpected exits with resets.

Known solutions for debugging standby mode issues in multi-power domain devices present significant drawbacks. One approach involves mapping internal signals to a multiplexer and device pads. This approach requires programming the multiplexer selection line to map the output to the pad, necessitating the constant availability of a primary circuit for changing the multiplexer selection. However, as discussed above, in many multi-power domain devices featuring standby mode, such a primary circuit is not always accessible, limiting the number of signals mapped to pads.

Even when signals are mapped to pads before entering low-power mode, debugging remains challenging due to the limited number of available pads. This constraint results in fewer signals being probed simultaneously, preventing engineers from obtaining a comprehensive view of the state of the multi-power domain device in a single iteration. Consequently, debugging often requires multiple sequence restarts, with the multiplexer selections being altered in software each time to capture different signals. This process significantly extends the time required for effective debugging. Further, this signal mapping scheme proves ineffective when resetting the device, limiting its utility in certain critical scenarios.

Another solution involves implementing a full debug architecture and core within the Always On domain. This approach creates a separate power domain that remains active during standby mode. However, this architecture can be complex to design and implement, and such a system's verification and integration processes are particularly challenging. Additionally, this solution dramatically increases power consumption during standby mode, potentially negating the power-saving benefits of entering standby in the first place.

Figure 6:
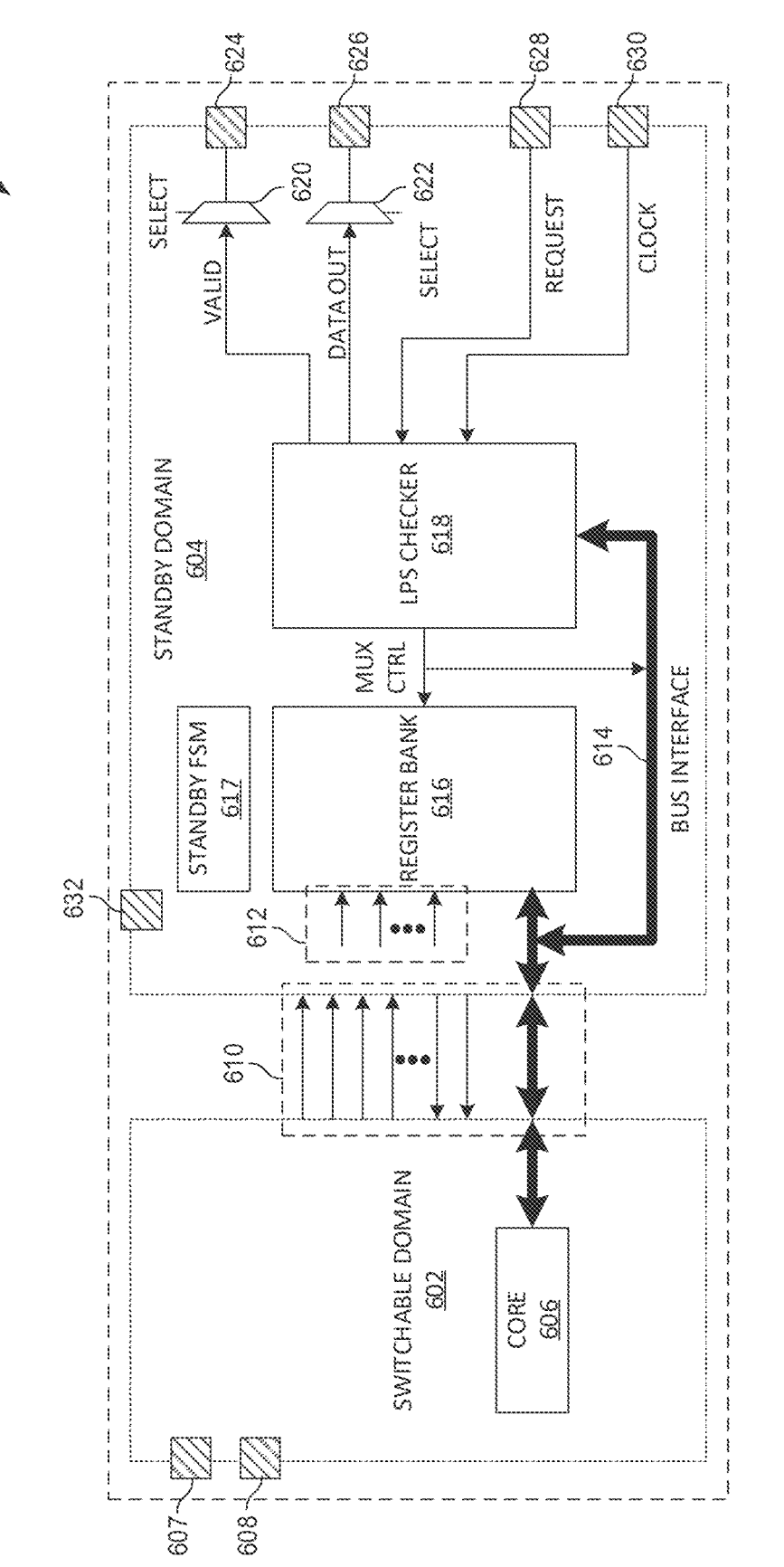
FIG. 6 is a simplified block diagram of an embodiment multi-power domain device.

FIG. 6 illustrates a simplified block diagram of an embodiment multi-power domain device 600. The multi-power domain device 600 includes a switchable domain 602 and a standby domain 604, which may (or may not) be arranged as shown. In embodiments, the switchable domain 602 and the standby domain 604 may be implemented, respectively, as the third power domain 106 and the first power domain 102 of the system-on-chip 100 of FIG. 1. The switchable domain 602 and the standby domain 604 are coupled via interface 610 to exchange signals.

The switchable domain 602 includes a core circuit 606, a first pad 607, and a second pad 608, which may (or may not be arranged as shown). Switchable domain 602 may include additional components that are not shown.

In embodiments, core circuit 606 is configured as a primary controller in the switchable domain 602. The core circuit 606 can execute instructions and manage overall system operations within the switchable domain 602. In embodiments, the core circuit 606 is an ARM-based processor.

The first pad 607 and the second pad 608 can serve as interfaces for external devices to interact with and control debug-related operations of the multi-power domain device 600.

In embodiments, a clear bit manages latched registers of the register bank 616 in the standby domain 604. When activated, the clear bit erases the contents of these latched registers, ensuring that any previously stored data is removed. This clearing operation can be important when initiating a standby entry sequence for a second time, as it prevents old data from interfering with new observations. In embodiments, the clear bit is controlled through software. In embodiments, the clear bit signal can be triggered internally using hardware. For example, the clear bit can be triggered using an ARM core.

An enable bit can control whether a flip-flop can capture signal changes. For example, when the enable bit is set to logic level high ('1'), the flip-flop can record incoming data. In the event of an unintended reset, the flip-flops's enable signal switches to logic level low ('0'), preventing the capture of unwanted signals. The enable bit ensures the system does not inadvertently capture and store irrelevant or misleading signal data during reset operations.

The standby domain 604 includes a bus interface 614, a register bank 616, a standby FSM circuit 617, a low-power system (LPS) checker circuit 618, a first multiplexer 620, a second multiplexer 622, a first pad 624, a second pad 626, a third pad 628, a fourth pad 630, and a fifth pad 632, which may (or may not) be arranged as shown. The standby domain 604 may include additional components that are not shown, such as a core circuit, wake-up circuitry, a debug interface, a digital power management controller, an analog power management controller, or a reset circuit.

Bus interface 614 provides a means for the components within the standby domain 604 to communicate with each other and to external components within other domains, such as the switchable domain 602.

Register bank 616 is a tool for debugging and analyzing standby mode behaviors, offering detailed visibility into critical signal transitions and FSM states without requiring continuous operation of power-intensive master circuits. Register bank 616 is coupled to the switchable domain 602, the core circuit 606 of the switchable domain 602, and the LPS checker circuit 618.

Register bank 616 is configured to capture and store the critical signals 612. In embodiments, register bank 616 includes a set of 32-bit registers, each mapped to a specific critical signal. By default, the registers return the reset values of their corresponding critical signal when accessed. The capturing mechanism can be activated by setting a dedicated register bit, enabling the system to monitor and record the transitions of a critical signal.

In embodiments, register bank 616 can capture both positive and negative edge transitions of the critical signals 612, storing the information in separate registers. The dual-edge capture provides a comprehensive view of the observed critical signal behavior during standby mode transitions. For example, by monitoring the critical signal's behavior, it can be determined whether the multi-power domain device 600 is stuck. In embodiments, the register bank 616 is coupled to 100 to 200 different critical signals and configured to capture the value of the critical signals at each positive and negative.

In embodiments, to monitor the standby FSM circuit 617, the register bank 616 includes specialized registers to capture the current stage of the FSM along with a counter that increments with each state change, offering detailed insights into the progression of the standby sequence.

In embodiments, the standby FSM circuit 617 is integrated within the digital power management controller 212. Standby FSM circuit 617 can manage smooth transitions between various power modes, specifically from standby mode to low power mode and run mode. Standby FSM circuit 617 interacts closely with the analog power management controller 302 to coordinate transitions effectively. The interaction between digital power management controller 212 and analog power management controller 302 ensures that both digital and analog components of the system are synchronized during mode changes. The coordination provides system stability and optimizes power consumption across different operational states.

To maintain data integrity, upon the assertion of a reset signal, the capturing mechanism is automatically disabled, and the capturing bit is reset, preventing false or erroneous signal captures during reset events. As previously discussed, a software-controllable clear bit can be used to clear the contents of the latched registers, ensuring clean data before initiating subsequent standby entry sequences.

Register bank 616 can feature a flexible data output mechanism. For example, specific address ranges can be programmed to be shifted out to the first pad 624 and the second pad 626, allowing for selective examination of captured data. If no specific range is programmed, the default condition is to shift out all address contents, providing a comprehensive data dump for analysis.

In embodiments, during normal operation, register bank 616 is readable through the bus interface 614 via the core circuit 606—see step 708. In embodiments, register bank 616 is readable through the LPS checker circuit 618—see step 712. For example, the core circuit 606 can read register bank 616 when the reset is not a power-on reset. In this configuration, the LPS checker circuit 618 provides a multiplexer control (MUX CTRL) signal to register bank 616 to cut off the path for the core circuit 606 and enable the LPS checker circuit 618 to access data, which is made accessible to the second pad 626, externally accessible. No data is accessible at the core circuit 606.

LPS checker circuit 618 is configured to read data from register bank 616 and map the data to the second pad 626. LPS checker circuit 618 may be implemented as a finite state machine (FSM) circuit. In embodiments, LPS checker circuit 618 is used for issues similar to that discussed with respect to FIG. 5.

In embodiments, LPS checker circuit 618 is configured to receive a request signal from the third pad 628 and a clock signal from the fourth pad 630. In embodiments, the third pad 628 is optional and the LPS checker circuit 618 receives the clock signal without receiving a request signal. In embodiments, the request signal is a pulse signal, which can be triggered by, for example, pulling to a logic level high '1'. In embodiments, the clock signal is a free-running clock signal.

In embodiments, in response to a request signal being triggered, the LPS checker circuit 618 or an FSM circuit inside the LPS checker circuit 618 fetches data from the register bank 616 starting from the first address of the register bank 616. The LPS checker circuit 618 then provides the data fetched from the register bank 616 to the second pad 626 based on the clock signal provided at the fourth pad 630. In embodiments, the FSM circuit of the LPS checker circuit 618 transitions from one state to another in synch with the clock signal provided at the fourth pad 630.

LPS checker circuit 618 is configured to provide a valid signal to the first multiplexer 620 and data out signals to the second multiplexer 622. When the valid signal is asserted, the data out signal is valid. For example, when the valid signal transitions to a '1' on the first pad 624, the data out signal on the second pad 626 can be observed and analyzed for debugging. The values on the first pad 624 and the second pad 626 can be observed using, for example, an oscilloscope by a validation engineer for debugging the multi-power domain device 600 during debug mode.

In embodiments, the first multiplexer 620 and the second multiplexer 622 are general-purpose multiplexers that allow more than one IP to be mapped to externally accessible pads. Accordingly, they are optional. Further, other externally accessible pads may also be coupled to a general-purpose multiplexer to minimize the number of pads and to map various IPs to a single pad efficiently. The first multiplexer 620 and the second multiplexer 622 may include additional inputs (not shown) coupled to other IP within the multi-power domain device 600.

Upon receiving a select signal, the first multiplexer 620 provides the valid signal to the first pad 624, accessible externally. The second multiplexer 622, upon receiving a select signal, provides the data out signals to the second pad 626. In embodiments, the multiplexer select signals are provided by a standard interface that controls the pads of the multi-power domain device 600. In embodiments, the multiplexer select signals are generated from the switchable domain 602.

In embodiments, the multiplexer control (MUX CTRL) signal manages access to the register bank 616 from two distinct sources: the LPS checker circuit 618 and the core circuit 606. The control mechanism allows both sources to share a common read path, but with an address signal that originates from either source. The multiplexers effectively determine which source receives the actual data. When the core circuit 606 initiates access, it receives the captured data while the LPS checker circuit 618 sees the read-data as 0. Conversely, when the LPS checker circuit 618 initiates access, it receives the captured data while the core circuit 606 sees the read-data as 0. The system ensures data isolation and prevents conflicts by allowing only the initiating source to access the real data, while the other source receives a null value. Accordingly, the multiplexers maintain the integrity of data access in the system where multiple components may need to be read from the same register bank 616.

LPS checker circuit 618 can have multiple operating modes during standby. For example, LPS checker circuit 618 can operate based on step 714 in a first operating mode and operate based on step 716 in a second operating mode. In either operating mode, data is shifted to the second pad 626.

In embodiments, critical signals are mapped in pairs of 32-bit registers within the register bank 616. An address may be required to identify which signals are currently being observed on the externally accessible pads. The address allows engineers to consult the documentation and determine which 32 signals are under observation at any given time. As each element that needs to be read by software is assigned a unique address, the addressing system enables precise control and monitoring of various hardware components, facilitating efficient communication between software and hardware layers. Using this method, engineers can systematically access and analyze different signals, ensuring comprehensive oversight of the system's operation.

In embodiments, the address data is shifted out first, followed by the data, and finally, the parity bit. In embodiments, data information is toggled at every clock cycle provided through the fourth pad 630. In embodiments, the parity bit is based on an even/odd parity of the combined address and data bits. In embodiments, the parity bit is optional. If the parity bit observed during shift out does not match the calculated even/odd parity of the combined address and data bits, it can indicate an issue along the path from the LPS checker circuit 618 and the second pad 626.

The critical signals provided to the register bank 616 can be continuously observed at the externally accessible pads of the standby domain 604 during debug mode. The latched data is available for every low-power entry and exit sequence. Advantageously, no primary circuit is needed; accordingly, no change in design functionality is required. Advantageously, the proposed device speeds up the debugging process if the device is stuck in the entry or exit of the standby mode.

In embodiments, the fifth pad 632 receives a reset signal from an external source to enable a controlled restart of the multi-power domain device 600 without completely powering it down. For example, if the standby domain becomes stuck during standby entry or exit, an externally applied reset signal can be applied to the fifth pad 632 to reset the standby domain 604. In embodiments, the externally applied reset signal is distinct from a power-on reset.

The proposed system allows for the power analysis debugging of the multi-power domain device 600 when in stuck condition or when the analog or digital IPs are in the OFF condition during standby mode. Without the use of a primary circuit, the status of the critical signals can be shifted out to the second pad 626 per request or the latched data of every standby entry/exit can be read (e.g., later) by the core circuit 606.

Figure 7:
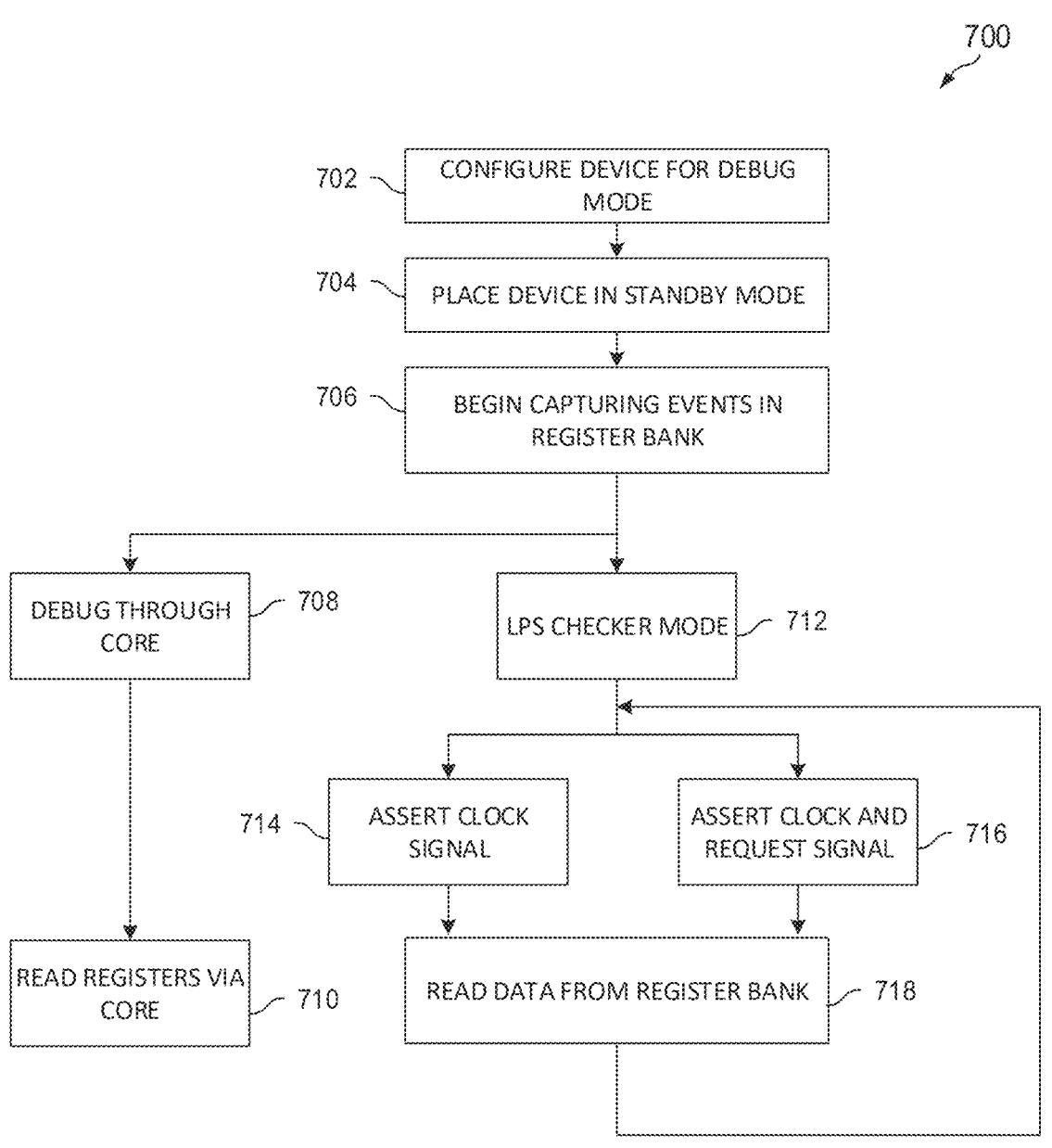
FIG. 7 is a flow chart of an embodiment method for debugging a multi-power domain device.

FIG. 7 illustrates a flow chart of an embodiment method 700 for debugging a multi-power domain device, which can be implemented within the multi-power domain device 600. It is noted that all steps outlined in the flow chart of method 700 are not necessarily required and can be optional. Further, changes to the arrangement of the steps, removal of one or more steps and path connections, and addition of steps and path connections are similarly contemplated.

At step 702, the multi-power domain device is configured for debug mode. At step 704, the device is placed into standby mode. In embodiments, a software program enters the multi-power domain device into standby mode.

At step 706, once the multi-power domain device is in standby mode, the capturing of events into a register bank commences. In embodiments, the capturing of events begins as soon as the debug mode is enabled.

In embodiments, method 700 diverges to step 708, where the debugging of the multi-power domain device is processed through a core circuit. In embodiments, method 700 diverges to step 712, where the debugging of the multi-power domain device is processed through an LPS checker circuit. The choice between debugging through the core circuit or the LPS checker circuit is flexible. Debugging tools can select the most appropriate path based on their specific requirements.

At step 710, to check the standby exit through the wake-up circuitry or a reset signal, the registers of the register bank are read via the core circuit to check their status. In embodiments, the core circuit is the core circuit 606 in the switchable domain 602.

Here, method 700 again diverges to step 714 or step 716 based on the pad interface of the standby domain. If the standby domain includes four externally accessible pads, the multi-power domain device can use either steps 714 or 716. If the standby domain includes three externally accessible pads (i.e., the third pad 628 is excluded), the multi-power domain device uses step 714. At step 714, a clock signal is applied through an externally accessible pad. At step 716, a request signal and a clock signal are applied through externally accessible pads.

At step 718, the data is read from the register bank through an externally accessible pad. In embodiments, if the clock signal and the request signal are applied, the data output is based on a first protocol—further detailed below concerning protocol 1200. In embodiments, if the clock signal is the only signal being applied, the data output is based on a second protocol—further detailed below concerning protocol 1400. In embodiments, the selection between protocol 1200 and protocol 1400 is software based. Accordingly, in an embodiment, the standby domain 604 can include four pads; however, based on software programming, protocol 1400 is used without the need to trigger the request signal through the third pad 628.

If debugging through the core, the system applies a clock signal (CLK) to read data from the register bank. The resulting data can be made available to the core and analyzed, for example, through software. Alternatively, in the LPS checker mode, the system applies both CLK and, after a few cycles, a request (REQ) signal. This leads to reading data from the register bank and outputting it on the PAD as per Protocol 1200. Method 700 returns to step 714 or 716, based on the pad interface, if additional data is requested.

FIG. 8 illustrates a flow chart of an embodiment method 800 for configuring a multi-power domain device for debugging. In embodiments, method 800 is implemented as step 702 of method 700. It is noted that all steps outlined in the flow chart of method 800 are not necessarily required and can be optional. Further, changes to the arrangement of the steps, removal of one or more steps and path connections, and addition of steps and path connections are similarly contemplated.

At step 802, the select signals for the first multiplexer 620 and the second multiplexer 622 are programmed to map ports of the LPS checker circuit 618 to the first pad 624 and the second pad 626. In embodiments, step 802 is optional and the select signals are pre-programmed.

At step 804, LPS checker circuit 618 is programmed to shift out data either on the request signal or the clock signal.

At step 806, the address range of the register bank 616 is programmed if specific registers need to be checked. In embodiments, step 806 is optional. Step 806 allows for targeted debugging by focusing on particular areas of interest within the registers of register bank 616.

At step 808, the low-power debug mode can be enabled by asserting an enable bit through software. For example, the enable bit can be enabled by software through a dedicated bit available within the hardware. Enabling the low-power debug mode activates the data capture mechanism.

FIG. 9 illustrates a flow chart of an embodiment method 900 for capturing and managing critical signal data in the multi-power domain device 600. It is noted that all steps outlined in the flow chart of method 900 are not necessarily required and can be optional. Further, changes to the arrangement of the steps, removal of one or more steps and path connections, and addition of steps and path connections are similarly contemplated.

At step 902, each register of register bank 616 is mapped to a specific critical signal. In embodiments, initially, the registers return reset values when accessed. The capturing mechanism can be activated by setting a designated register bit, enabling the system to monitor signal transitions.

At step 904, the status of each critical signal is captured on both positive and negative edges. In embodiments, the captured information is stored in separate registers of register bank 616.

At step 906, the states of the standby FSM states circuit 617 are monitored by capturing the current FSM stage and incrementing a counter with each state change.

At step 908, upon reset assertion, the capturing mechanism is disabled, and the capturing bit is reset to prevent false signal captures.

At step 910, a software-controlled clear bit can be provided to clear the latched registers' contents, ensuring clean data before initiating new standby entry sequences.

At step 912, the data is shifted out to the second pad 626 for selective data output, where specific address ranges can be shifted out based on register programming, or if no specific range is programmed, the shifting out of all address contents.

FIG. 10 illustrates a flow chart of an embodiment method 1000 for analyzing and recovering from standby mode issues in the multi-power domain device 600. It is noted that all steps outlined in the flow chart of method 1000 are not necessarily required and can be optional. Further, changes to the arrangement of the steps, removal of one or more steps and path connections, and addition of steps and path connections are similarly contemplated.

At step 1002, upon completion of standby entry or exit sequences, the system retains detailed information about the steps successfully executed during these transitions. This data can provide a comprehensive overview of the multi-power domain device 600 through the standby process.

At step 1004, if the device becomes stuck during standby entry or exit, an externally applied reset signal can be applied through the fifth pad 632 to reset the multi-power domain device 600. The externally applied reset signal is distinct from a power-on reset in embodiments. This targeted reset enables a controlled restart of the multi-power domain device 600 without completely powering it down.

At step 1006, the register bank can be accessed to retrieve the latched data. This data can offer insights into the state of the multi-power domain device 600 before encountering an issue, revealing how far the standby sequence progressed before it became stuck. Examining this information can pinpoint the exact stage where the problem occurred, facilitating more efficient debugging and targeted improvements.

FIG. 11 illustrates a flow chart of an embodiment method 1100 for the data retrieval process during the debugging of the multi-power domain device 600. It is noted that all steps outlined in the flow chart of method 1100 are not necessarily required and can be optional. Further, changes to the arrangement of the steps, removal of one or more steps and path connections, and addition of steps and path connections are similarly contemplated.

At step 1102, a clock signal is applied at fourth pad 630, a request signal is applied at third pad 628, or a combination thereof, depending on the desired mode of operation.

At step 1104, regardless of the chosen mode of operation, data is shifted out on the second pad 626. The data can be shifted out based on a particular protocol. In embodiments, the address is shifted out first, followed by the data, and concludes with a parity bit. In embodiments, the address and data are transmitted with the most significant bit (MSB) first, ensuring a consistent data format. In embodiments, the parity bit, based on either even or odd parity of the combined address and data, serves as an error-checking mechanism.

At step 1106, a valid signal is provided to the first multiplexer 620, which is transferred to the first pad 624, accessible externally, in response to asserting the select signal. The valid signal indicates to external probes coupled to the first pad 624 the precise moment to begin capturing data, with data toggling occurring on each clock cycle for reliable transmission.

Method 1100 can be advantageous when the multi-power domain device 600 is stuck in a reset phase, and a power-on reset (POR) is the only recovery option. In such cases, the status of critical signals can be read, providing diagnostic information even when the multi-power domain device 600 is in a severely compromised state. This approach offers a robust means of extracting vital data from the multi-power domain device 600 under extreme conditions, aiding in troubleshooting and analyzing complex system failures.

FIG. 12 illustrates a timing diagram of an embodiment protocol 1200 to read data through the pad interface. FIG. 13 illustrates a flow chart of an embodiment method 1300 for reading the data through the pad interface based on protocol

1200. It is noted that all steps outlined in the flow chart of method 1300 are not necessarily required and can be optional. Further, changes to the arrangement of the steps, removal of one or more steps and path connections, and addition of steps and path connections are similarly contemplated.

Protocol 1200 is used to observe a specific set of critical signals without observing every data point (i.e., user-requestable observation of select critical signals). Specifically, protocol 1200 can be utilized when the pad interface includes the first pad 624, the second pad 626, the third pad 628, and the fourth pad 630. The timing diagram of protocol 1200 illustrates an operation of reading data through the pad interface over a 37-cycle period, showing the relationships between the clock signal 1202, the request signal 1204, the data 1206, and valid signal 1208, with the data 1206 carrying address bits [3:0], data bits [31:0], and the parity (PAR) bit in the sequence.

At step 1302, a clock signal 1202 is applied at the fourth pad 630. The clock signal 1202 serves as the timing reference for all subsequent operations. At step 1304, a request signal 1204 is applied at the third pad 628 to initiate the data transfer sequence.

At step 1306, after a three-cycle delay after the application of the request signal, data 1206 is shifted out from a first memory location onto the second pad 626. During this data transmission, a valid signal 1208 is asserted high, remaining in this state until the complete data packet, including the parity bit, has been transferred. The valid signal 1208 is observable at the first pad 624. Accordingly, once the request signal 1204 is triggered, over the next 37 cycles of the clock signal 1202, during which the valid signal 1208 is at a logic level high, the data 1206 is made available at the second pad 626. It should be appreciated that the three-cycle delay and the number of cycles to capture the data signal are non-limiting and are provided as an exemplary embodiment.

At step 1308, if additional data is required, the process allows for the application of another request signal 1204 at the third pad 628.

At step 1310, upon receiving a subsequent request signal 1204, data 1206 is shifted out from the next memory location to the second pad 626. This cyclic process continues, returning to the first location after the last location's data has been transmitted, creating a continuous loop of data output.

In embodiments, protocol 1200 incorporates a parity bit for error checking, calculated based on the even/odd parity of the combined address and data bits. This parity bit is appended to each data transmission, enhancing data integrity.

A feature of protocol 1200 is its handling of concurrent requests. If a new request signal 1204 is received while data 1206 is still being shifted out, the premature request signal is ignored/discarded. The new request signal 1204 will only be considered valid and processed after the current data transmission, including its parity bit, has been completely shifted out. This mechanism can ensure the integrity and completeness of each data transmission cycle.

Figures 14, 15:
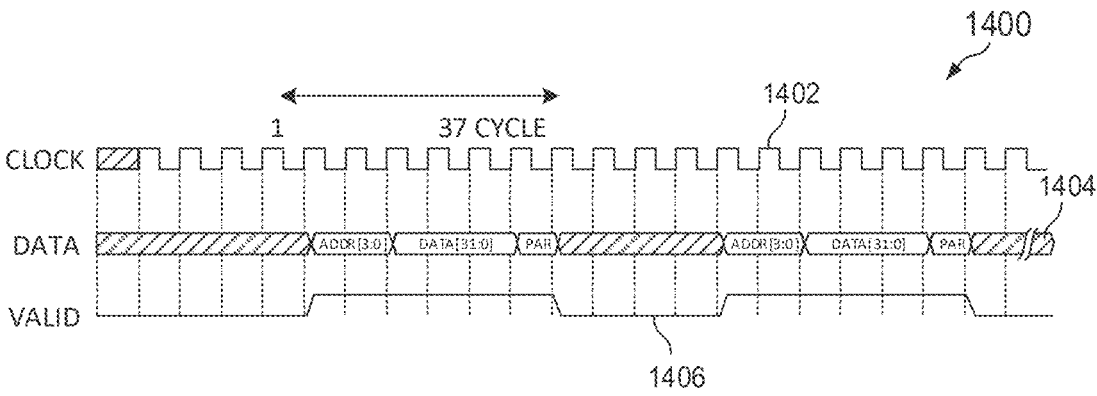
FIG. 14 is a timing diagram of an embodiment protocol to read data through the pad interface.
FIG. 15 is a flow chart of an embodiment method for reading the data through the pad interface based on protocol.

FIG. 14 illustrates a timing diagram of an embodiment protocol 1400 to read data through the pad interface. FIG. 15 illustrates a flow chart of an embodiment method 1500 for reading the data through the pad interface based on protocol 1400. It is noted that all steps outlined in the flow chart of method 1500 are not necessarily required and can be optional. Further, changes to the arrangement of the steps, removal of one or more steps and path connections, and addition of steps and path connections are similarly contemplated.

Specifically, protocol 1400 can be utilized when the pad interface includes the first pad 624, the second pad 626, and the fourth pad 630 (excluding the third pad 628). The timing diagram of protocol 1400 illustrates an operation of reading data through the pad interface over a 37-cycle period, showing the relationships between the clock signal 1402, the data 1404, and valid signal 1406, with the data 1404 carrying address bits [3:0], data bits [31:0], and the parity (PAR) bit in the sequence.

At step 1502, a clock signal 1402 is applied at the fourth pad 630. The clock signal 1402 is the primary timing reference for all subsequent operations.

At step 1504, after a three-cycle delay after the initial clock application, data 1404 is shifted out from a first memory location onto the second pad 626. During this data transmission, a valid signal 1406 is asserted high, remaining in this state until the complete data packet, including the parity bit, has been transferred. The valid signal 1208 is observable at the first pad 624.

At step 1506, if additional data is required, protocol 1400 simplifies the request process by relying solely on the continued application of the clock signal 1402. Each subsequent clock cycle triggers data transmission from the next memory location to the second pad 626. This creates a continuous, cyclical data output process, where the system returns to the first location after transmitting data from the last location, forming a loop.

In embodiments, protocol 1400 maintains data integrity by including a parity bit with each transmission. This parity bit can be calculated as the exclusive OR (XOR) operation between the address and data bits, providing a simple error-checking mechanism.

Protocol 1400 offers a more streamlined approach compared to the request-based protocol in protocol 1200, as it relies on the clock signal 1402 for timing and data request functions, simplifying the overall system design and operation and minimizing the number of pads from four for protocol 1200 to three for protocol 1400.

Figure 16:
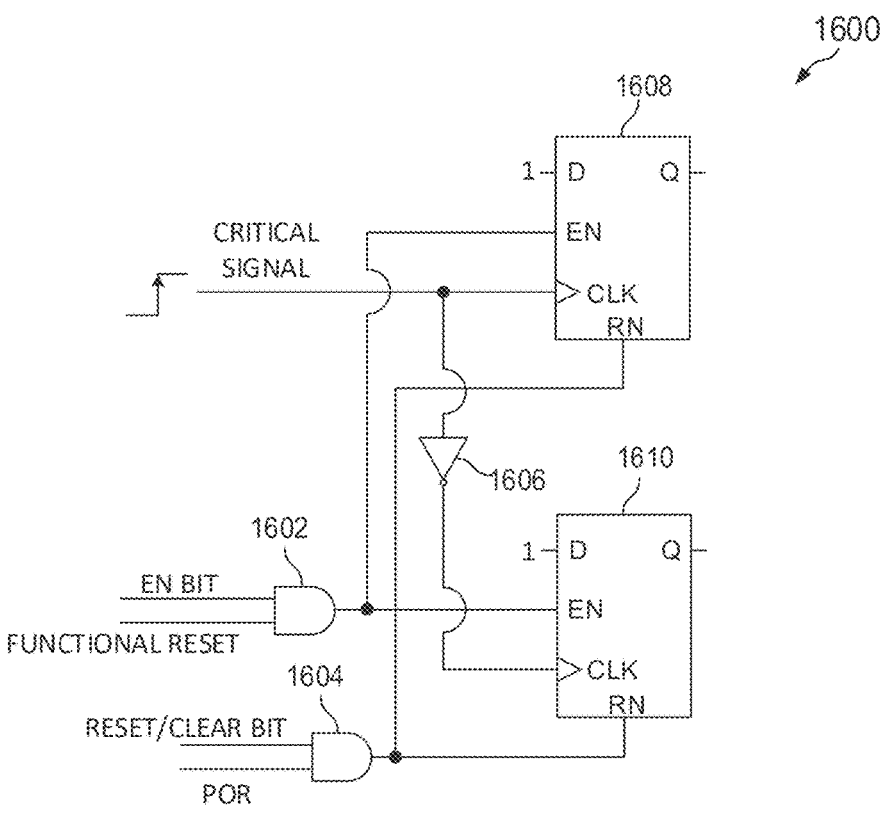
FIG. 16 is a schematic of an embodiment latch circuit.

FIG. 16 illustrates a schematic of an embodiment latch circuit 1600. In embodiments, latch circuit 1600 is configured to capture and store critical signal data during debug mode in the multi-power domain device 600. In embodiments, latch circuit 1600 is implemented in the register bank 616 of FIG. 6.

Register bank 616 may include multiple latch circuits similar to latch circuit 1600. For example, there may be a one-to-one correspondence between the number of latch circuits and the number of critical signals to be monitored.

In an embodiment where the core circuit 606 is a 32-bit core (i.e., capable of processing 32-bit data), the register bank 616 includes at least 16 instances of the latch circuit 1600 in a chain of 32 flip-flops. When the core circuit 606 initiates a read request, it reads in parallel the output (Q) values of the flip-flops in the chain of flip-flops. The core circuit 606 can read additional addresses of the register bank 616 by making additional requests and reading output (Q) values of the flip-flops in a different chain of flip-flops.

Latch circuit 1600 includes a first AND gate 1602, a second AND gate 1604, an inverter 1606, a first flip-flop 1608, and a second flip-flop 1610, which may (or may not) be arranged as shown. Latch circuit 1600 may include additional components not shown.

The first AND gate 1602 is configured to provide enable signals to the first flip-flop 1608 and the second flip-flop

1610 to control the enabling of data capture. The first AND gate 1602 receives a functional reset signal at a first input and an enable bit at a second input. In embodiments, the enable bit is received from an internal hardware bit. The output of the first AND gate 1602 is coupled to the enable (EN) input of the first flip-flop 1608 and the second flip-flop 1610. The enable signal can be asserted to enable debug mode. In embodiments, the enable signal is a bit that be programmed via software.

The second AND gate 1604 is configured to provide reset signals to the first flip-flop 1608 and the second flip-flop 1610 to manage reset functionality. The second AND gate 1604 receives a power-on-reset (PoR) signal at a first input and a reset signal. In embodiments, the reset signal is provided by a central reset control circuit. The reset signal from the external source enables a controlled restart of the multi-power domain device 600 without completely powering it down. The output of the second AND gate 1604 is coupled to the reset negative (RN) of the first flip-flop 1608 and the second flip-flop 1610.

Typically, in digital SoCs, there are distinct types of reset mechanisms, each serving specific purposes. For example, a power-on-reset is a reset type that activates when the device is powered off or when the supply voltage drops below a critical threshold. For instance, if a device designed to operate at 1 volt experiences a voltage dip to 0.8 volts, falling below its operational threshold of 0.85 volts, it automatically enters a power-on reset state. The power-on-reset can be triggered by voltage-sensing circuitry that monitors the supply voltage levels.

In contrast, functional resets operate differently. They can be initiated either through software commands, where a specific IP is programmed to generate a reset signal or through hardware-based mechanisms. A key distinction between power-on reset and functional reset lies in their scope and impact on the device's logic. While certain logic elements are designed to maintain their state during functional resets, no logic within the device can withstand a power-on reset.

In embodiments, the first flip-flop 1608 and the second flip-flop 1610 are different registers (i.e., register fields) within the register bank 616. A critical signal is fed into the clock input of the first flip-flop 1608. The critical signal is inverted through the inverter 1606 before being fed to the clock input of the second flip-flop 1610. The data inputs (D) of the first flip-flop 1608 and the second flip-flop 1610 are permanently set to a logic level high (e.g., '1').

When the debug mode is enabled through the enable bit, the first flip-flop 1608 and the second flip-flop 1610 capture and hold transitions (falling and rising edges) of the observable critical signal. The first flip-flop 1608 captures the rising edge of the observable critical signal, and the second flip-flop 1610 captures the falling edge of the critical signal.

When the critical signal transitions from a '0' to a '1' (i.e., rising edge transition), the value of the critical signal is latched into the first flip-flop 1608. When the critical signal transitions from a '1' to a '0' (i.e., falling edge transition), the value of the critical signal is latched into the second flip-flop 1610. Accordingly, the registers (i.e., the first flip-flop 1608 and the second flip-flop 1610) associated with the critical signal can be read separately.

In embodiments, latch circuit 1600 is configured so that the enable signal reaches the registers' enable input before the critical signal reaches the registers' clock input. In this configuration, if a functional reset signal is triggered before the critical signal transitions from, for example, '1' to a '0', the functional reset signal will disable the registers and block capturing. This allows the registers to retain the stored value immediately before the reset signal is asserted.

The initial state of the output (Q) of the first flip-flop 1608 is '0'—the registers of the register bank 616 are initially set to '0'. When the critical signal transitions from a '0' to a '1', the output (Q) of the first flip-flop 1608 changes state to '1', the value of a first register in the register bank 616. Likewise, the initial state of the output (Q) of the second flip-flop 1610 is '0'. When the critical signal transitions from '1' to '0', the output (Q) of the second flip-flop 1610 changes state to '1', the value of a second register in the register bank 616.

In embodiments, the core circuit 606 can read the values of the first register and the second register of the register bank 616 to determine whether the critical signal being observed properly transitioned from '0' to '1' and from '1' to '0'. If both registers have a value equal to '1', then the core circuit 606 determines that the standby FSM circuit 617 is operating smoothly. However, if either of the register banks has a value of '0', the core circuit 606 determines that the standby FSM circuit 617 has an issue and the observed critical signal does not properly transition. Accordingly, by observing the values of the register bank 616, a design engineer can determine issues related to the multi-power domain device 600 and commence troubleshooting of the corresponding circuit related to the critical signal.

Figure 17:
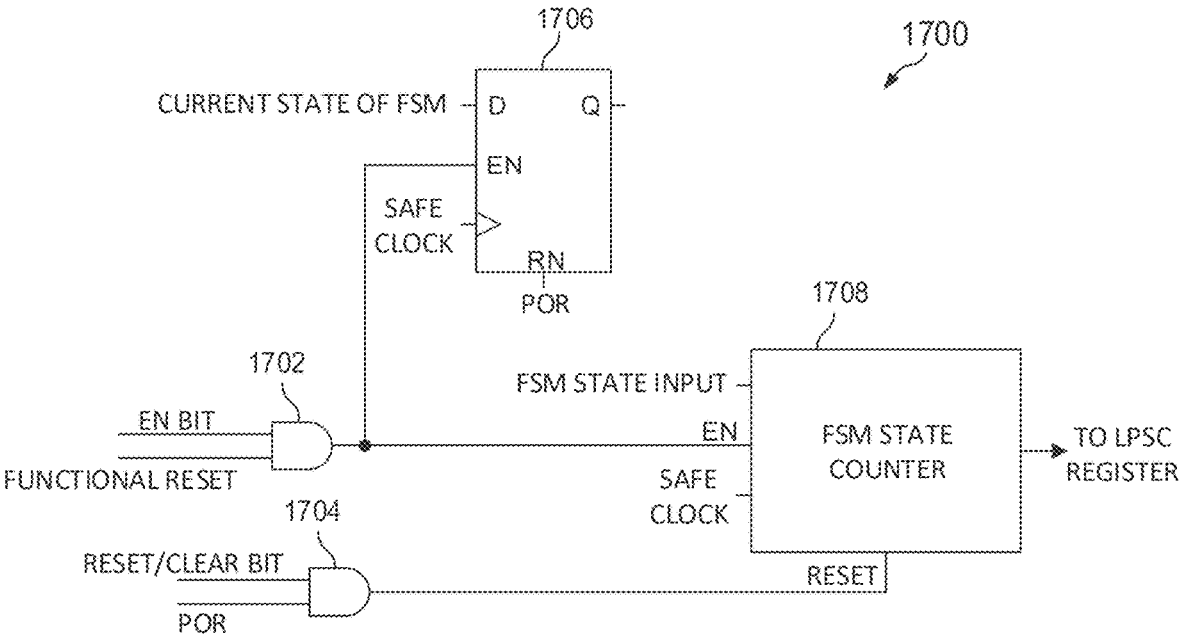
FIG. 17 is a schematic of an embodiment latch circuit.

FIG. 17 illustrates a schematic of an embodiment latch circuit. In embodiments, latch circuit 1700 is configured to capture and store FSM state information during debug mode in the multi-power domain device 600. In embodiments, latch circuit 1700 is implemented in the register bank 616 of FIG. 6.

Generally, FSM state transitions occur quickly. For example, when a standby entry request or a standby exit request is made, an FSM may transition ten to twenty states during that sequence.

Latch circuit 1700 includes a first AND gate 1702, a second AND gate 1704, a flip-flop 1706, and an FSM state counter 1708, which may (or may not) be arranged as shown. Latch circuit 16700 may include additional components not shown.

The first AND gate 1702 is configured to provide enable signals to the flip-flop 1706 and the FSM state counter 1708 to control the enabling of the capturing of FSM state information. The first AND gate 1702 receives a functional reset signal at a first input and an enable bit at a second input. In embodiments, the enable bit is set by software. The output of the first AND gate 1702 is coupled to the enable (EN) input of the flip-flop 1706 and the FSM state counter 1708.

The second AND gate 1704 is configured to provide reset signals to the flip-flop 1706 and the FSM state counter 1708 to manage reset functionality. The second AND gate 1704 receives a power-on-reset (PoR) signal at a first input and a reset signal. In embodiments, the reset signal is provided by a central reset control circuit. The reset signal from the external source enables a controlled restart of the multi-power domain device 600 without completely powering it down. The output of the second AND gate 1704 is coupled to the reset input of FSM state counter 1708.

During debug mode, the flip-flop 1706 captures the current state of the standby FSM circuit 617. The current state of the standby FSM circuit 617 is fed into the data input (D) of the flip-flop 1706. The reset not (RN) input of the flip-flop 1706 is permanently coupled to the power-on-reset (PoR) signal. A safe clock signal clocks the flip-flop 1706. The safe clock signal is the safest clock of the multi-power domain device 600. In embodiments, the safe clock signal is the minimum clock required to operate the multi-power domain device 600 functionally-without the safe clock, the multi-power domain device 600 cannot operate.

During debug mode, FSM state counter 1708 is configured to track state transitions of the standby FSM circuit 617. FSM state counter 1708 receives the state of the standby FSM circuit 617 at an input. FSM state counter 1708 is clocked by the same safe clock signal fed to the flip-flop 1706 clock input. The output of the FSM state counter 1708 is fed to a register of the LPS checker circuit 618, providing a record of FSM state changes.

A first aspect relates to a method for debugging a low-power domain in a multi-power domain device. The method includes mapping a critical signal of the low-power domain to a latch circuit of a register bank; capturing, by the latch circuit, transitions of the critical signal in registers of the register bank; observing, by a core circuit in a switchable power domain of the multi-power domain device, registers of the register bank; and determining a fault corresponding to the critical signal based on a value of the registers of the register bank.

In a first implementation form of the method, according to the first aspect as such, the method further includes mapping, by a low-power system capture circuit in the low-power domain, data stored in the registers of the register bank to an externally accessible pad; and determining a fault corresponding to the critical signal based on a value of the externally accessible pad.

In a second implementation form of the method, according to the first aspect as such or any preceding implementation form of the first aspect, the externally accessible pad is a first externally accessible pad. The method further includes applying a free-running clock on a second externally accessible pad coupled to the low-power system capture circuit; and triggering a pulse request signal through a third externally accessible pad coupled to the low-power system capture circuit, wherein the pulse request signal initiates the transmission of the data stored in the registers to the first externally accessible pad.

In a third implementation form of the method, according to the first aspect as such or any preceding implementation form of the first aspect, the method further includes mapping, by the low-power system capture circuit, a valid signal to a fourth externally accessible pad, wherein the valid signal is asserted during a period corresponding to the data stored in the registers being transmitted to the first externally accessible pad.

In a fourth implementation form of the method, according to the first aspect as such or any preceding implementation form of the first aspect, the method further includes triggering a second pulse request signal through the third externally accessible pad, wherein the second pulse request signal initiates a second instance of the transmission of data stored in the registers to the first externally accessible pad.

In a fifth implementation form of the method, according to the first aspect as such or any preceding implementation form of the first aspect, the method further includes selecting between observing the registers of the register bank using the core circuit or mapping data stored in the registers to the externally accessible pad.

In a sixth implementation form of the method, according to the first aspect as such or any preceding implementation form of the first aspect, the externally accessible pad is a first externally accessible pad. The method further includes applying a free-running clock signal on a second externally accessible pad coupled to the low-power system capture circuit, wherein receiving the free-running clock signal at the low-power system capture circuit initiates the transmission of the data stored in the registers to the first externally accessible pad.

A second aspect relates to a method for debugging a low-power domain in a multi-power domain device. The method includes mapping a critical signal of the low-power domain to a latch circuit of a register bank; capturing, by the latch circuit, transitions of the critical signal in registers of the register bank; mapping, by a low-power system capture circuit in the low-power domain, data stored in the registers of the register bank to an externally accessible pad; and determining a fault corresponding to the critical signal based on a value of the externally accessible pad.

In a first implementation form of the method, according to the second aspect as such, the externally accessible pad is a first externally accessible pad. The method further includes applying a free-running clock on a second externally accessible pad coupled to the low-power system capture circuit; and triggering a pulse request signal through a third externally accessible pad coupled to the low-power system capture circuit, wherein the pulse request signal initiates the transmission of the data stored in the registers to the first externally accessible pad.

In a second implementation form of the method, according to the second aspect as such or any preceding implementation form of the second aspect, the method further includes mapping, by the low-power system capture circuit, a valid signal to a fourth externally accessible pad, wherein the valid signal is asserted during a period corresponding to the data stored in the registers being transmitted to the first externally accessible pad.

In a third implementation form of the method, according to the second aspect as such or any preceding implementation form of the second aspect, the method further includes triggering a second pulse request signal through the third externally accessible pad. The second pulse request signal initiates a second instance of the transmission of data stored in the registers to the first externally accessible pad.

In a fourth implementation form of the method, according to the second aspect as such or any preceding implementation form of the second aspect, the externally accessible pad is a first externally accessible pad. The method further comprises applying a free-running clock signal on a second externally accessible pad coupled to the low-power system capture circuit. Receiving the free-running clock signal at the low-power system capture circuit initiates the transmission of the data stored in the registers to the first externally accessible pad.

In a fifth implementation form of the method, according to the second aspect as such or any preceding implementation form of the second aspect, the method further includes mapping, by the low-power system capture circuit, a valid signal to a fourth externally accessible pad. The valid signal is asserted during a period corresponding to the data stored in the registers being transmitted to the first externally accessible pad.

In a sixth implementation form of the method, according to the second aspect as such or any preceding implementation form of the second aspect, the method further includes providing a clear bit from power-on-reset or set through software.

A third aspect relates to a multi-power domain device comprising a low-power domain. The low-power domain includes a register bank, the register bank configured to store captured values associated with transitions of critical signals of the low-power domain during a debug mode; a plurality of externally accessible pads; and a low-power system capture circuit configured to map data stored in registers of the register bank to a first externally accessible pad to determine faults within the low-power domain.

In a first implementation form of the multi-power domain device, according to the third aspect as such, the multi-power domain device includes a switchable domain comprising a core circuit. The core circuit configured to read out data from the register bank during the debug mode to determine the faults within the low-power domain.

In a second implementation form of the multi-power domain device, according to the third aspect as such or any preceding implementation form of the third aspect, the multi-power domain device includes a bus interface coupling the core circuit to the register bank.

In a third implementation form of the multi-power domain device, according to the third aspect as such or any preceding implementation form of the third aspect, the register bank includes a first AND gate configured to receive a functional reset signal and a sourced enable bit; a second AND gate configured to receive a power-on-set signal and a sourced reset bit; a first flip-flop having an enable input coupled to an output of the first AND gate, a data input of the first flip-flop coupled to a logic high, a reset input of the first flip-flop coupled to an output of the second AND gate, a clock input of the first flip-flop configured to receive the critical signal; an inverter configured to generate an inverted critical signal; and a second flip-flop having an enable input coupled to an output of the first AND gate, a data input of the second flip-flop coupled to a logic high, a reset input of the second flip-flop coupled to an output of the second AND gate, a clock input of the second flip-flop configured to receive the inverted critical signal.

In a fourth implementation form of the multi-power domain device, according to the third aspect as such or any preceding implementation form of the third aspect, the register bank includes a first AND gate configured to receive a functional reset signal and a sourced enable bit; a second AND gate configured to receive a power-on-reset signal and a sourced reset bit; a flip-flop having an enable input coupled to an output of the first AND gate, a data input of the flip-flop coupled to a current state of a finite state machine (FSM) circuit being observed, a reset input of the flip-flop coupled to the power-on-reset signal, a clock input of the flip-flop configured to receive a safe clock signal; and an FSM counter circuit having an enable input coupled to an output of the first AND gate, a data input of the FSM counter circuit configured to receive a state of the FSM circuit, a reset input of the FSM counter circuit coupled to an output of the second AND gate, a clock input of the FSM counter circuit configured to receive the safe clock signal.

In a fifth implementation form of the multi-power domain device, according to the third aspect as such or any preceding implementation form of the third aspect, the multi-power domain device includes a first multiplexer coupled between the low-power system capture circuit and the first externally accessible pad; and a second multiplexer coupled between the low-power system capture circuit and a second externally accessible pad, the second externally accessible pad configured to provide a valid signal indicating whether data on the first externally accessible pad provides observable data for debugging.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A method for debugging a low-power domain in a multi-power domain device, the method comprising:
   mapping a critical signal of the low-power domain to a latch circuit of a register bank;
   capturing, by the latch circuit, transitions of the critical signal in registers of the register bank;
   observing, by a core circuit in a switchable power domain of the multi-power domain device, registers of the register bank; and
   determining a fault corresponding to the critical signal based on a value of the registers of the register bank.

2. The method of claim 1, further comprising:
   mapping, by a low-power system capture circuit in the low-power domain, data stored in the registers of the register bank to an externally accessible pad; and
   determining a fault corresponding to the critical signal based on a value of the externally accessible pad.

3. The method of claim 2, wherein the externally accessible pad is a first externally accessible pad, and wherein the method further comprises:
   applying a free-running clock on a second externally accessible pad coupled to the low-power system capture circuit; and
   triggering a pulse request signal through a third externally accessible pad coupled to the low-power system capture circuit, wherein the pulse request signal initiates the transmission of the data stored in the registers to the first externally accessible pad.

4. The method of claim 3, wherein the method further comprises mapping, by the low-power system capture circuit, a valid signal to a fourth externally accessible pad, wherein the valid signal is asserted during a period corresponding to the data stored in the registers being transmitted to the first externally accessible pad.

5. The method of claim 2, further comprising triggering a second pulse request signal through the third externally accessible pad, wherein the second pulse request signal initiates a second instance of the transmission of the data stored in the registers to the first externally accessible pad.

6. The method of claim 2, further comprising selecting between observing the registers of the register bank using the core circuit or mapping the data stored in the registers to the externally accessible pad.

7. The method of claim 2, wherein the externally accessible pad is a first externally accessible pad, wherein the method further comprises applying a free-running clock signal on a second externally accessible pad coupled to the low-power system capture circuit, wherein receiving the free-running clock signal at the low-power system capture circuit initiates the transmission of the data stored in the registers to the first externally accessible pad.

8. A method for debugging a low-power domain in a multi-power domain device, the method comprising:

mapping a critical signal of the low-power domain to a latch circuit of a register bank;

capturing, by the latch circuit, transitions of the critical signal in registers of the register bank;

mapping, by a low-power system capture circuit in the low-power domain, data stored in the registers of the register bank to an externally accessible pad; and determining a fault corresponding to the critical signal based on a value of the externally accessible pad.

9. The method of claim 8, wherein the externally accessible pad is a first externally accessible pad, and wherein the method further comprises:

applying a free-running clock on a second externally accessible pad coupled to the low-power system capture circuit; and triggering a pulse request signal through a third externally accessible pad coupled to the low-power system capture circuit, wherein the pulse request signal initiates the transmission of the data stored in the registers to the first externally accessible pad.

10. The method of claim 9, wherein the method further comprises mapping, by the low-power system capture circuit, a valid signal to a fourth externally accessible pad, wherein the valid signal is asserted during a period corresponding to the data stored in the registers being transmitted to the first externally accessible pad.

11. The method of claim 8, further comprising triggering a second pulse request signal through the third externally accessible pad, wherein the second pulse request signal initiates a second instance of the transmission of the data stored in the registers to the first externally accessible pad.

12. The method of claim 8, wherein the externally accessible pad is a first externally accessible pad, and wherein the method further comprises applying a free-running clock signal on a second externally accessible pad coupled to the low-power system capture circuit, wherein receiving the free-running clock signal at the low-power system capture circuit initiates the transmission of the data stored in the registers to the first externally accessible pad.

13. The method of claim 12, wherein the method further comprises mapping, by the low-power system capture circuit, a valid signal to a fourth externally accessible pad, wherein the valid signal is asserted during a period corresponding to the data stored in the registers being transmitted to the first externally accessible pad.

14. The method of claim 8, further comprising providing a clear bit from power-on-reset or set through software.

15. A multi-power domain device comprising a low-power domain, the low-power domain comprising:

a register bank configured to store captured values associated with transitions of critical signals of the low-power domain during a debug mode; and a low-power system capture circuit configured to map data stored in registers of the register bank to a first externally accessible pad to determine faults within the low-power domain.

16. The multi-power domain device of claim 15, further comprising a switchable domain comprising a core circuit configured to read out the data from the register bank during the debug mode to determine the faults within the low-power domain.

17. The multi-power domain device of claim 16, further comprising a bus interface coupling the core circuit to the register bank.

18. The multi-power domain device of claim 15, wherein the register bank comprises:

a first AND gate configured to receive a functional reset signal and a sourced enable bit;

a second AND gate configured to receive a power-on-set signal and a sourced reset bit;

a first flip-flop having an enable input coupled to an output of the first AND gate, a data input of the first flip-flop coupled to a logic high, a reset input of the first flip-flop coupled to an output of the second AND gate, a clock input of the first flip-flop configured to receive the critical signal;

an inverter configured to generate an inverted critical signal; and a second flip-flop having an enable input coupled to an output of the first AND gate, a data input of the second flip-flop coupled to a logic high, a reset input of the second flip-flop coupled to an output of the second AND gate, a clock input of the second flip-flop configured to receive the inverted critical signal.

19. The multi-power domain device of claim 15, wherein the register bank comprises:

a first AND gate configured to receive a functional reset signal and a sourced enable bit;

a second AND gate configured to receive a power-on-reset signal and a sourced reset bit;

a flip-flop having an enable input coupled to an output of the first AND gate, a data input of the flip-flop coupled to a current state of a finite state machine (FSM) circuit being observed, a reset input of the flip-flop coupled to the power-on-reset signal, a clock input of the flip-flop configured to receive a safe clock signal; and an FSM counter circuit having an enable input coupled to an output of the first AND gate, a data input of the FSM counter circuit configured to receive a state of the FSM circuit, a reset input of the FSM counter circuit coupled to an output of the second AND gate, a clock input of the FSM counter circuit configured to receive the safe clock signal.

20. The multi-power domain device of claim 15, further comprising:

a first multiplexer coupled between the low-power system capture circuit and the first externally accessible pad; and a second multiplexer coupled between the low-power system capture circuit and a second externally accessible pad, the second externally accessible pad configured to provide a valid signal indicating whether data on the first externally accessible pad provides observable data for debugging.

* * * * *